(12) United States Patent
Yokota

(10) Patent No.: US 10,339,907 B2
(45) Date of Patent: Jul. 2, 2019

(54) SIGNAL PROCESSING APPARATUS

(71) Applicant: CASIO COMPUTER CO., LTD., Shibuya-ku, Tokyo (JP)

(72) Inventor: Masuo Yokota, Fussa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/876,406

(22) Filed: Jan. 22, 2018

(65) Prior Publication Data

US 2018/0268794 A1    Sep. 20, 2018

(30) Foreign Application Priority Data

Mar. 15, 2017    (JP) .................. 2017-049459

(51) Int. Cl.
  *G10H 7/00*    (2006.01)
  *G10H 7/10*    (2006.01)
  (Continued)

(52) U.S. Cl.
  CPC ............. *G10H 1/043* (2013.01); *G10H 1/125* (2013.01); *H03H 17/0213* (2013.01);
  (Continued)

(58) Field of Classification Search
  CPC ....... H04R 2430/00; H03H 2017/0297; H03H 17/0211; H03H 2017/0081;
  (Continued)

(56) References Cited

U.S. PATENT DOCUMENTS 5,195,140 A * 3/1993 Kudo .................. G10H 1/0091
                                                        381/63
5,248,845 A * 9/1993 Massie ................ G10H 1/125
                                                        84/622

(Continued)

FOREIGN PATENT DOCUMENTS

JP    2003263178 A    9/2003
JP    2003280675 A    10/2003
(Continued)

OTHER PUBLICATIONS

Gardner, "Efficient Convolution without Input-Output Delay," J. Audio Eng. Soc., vol. 43, No. 3, Mar. 1995, pp. 127-136.

*Primary Examiner* — Marlon T Fletcher
(74) *Attorney, Agent, or Firm* — Holtz, Holtz & Volek PC

(57) ABSTRACT

A signal processing apparatus has a first memory in which plural pieces of FIR coefficient data used for implementing an FIR filter algorithm are stored, a second memory which stores plural pieces of input data to be subjected to the FIR filter algorithm, and a processor implements the FIR filter algorithm using the plural pieces of FIR coefficient data stored in the first memory and the plural pieces of input data stored in the second memory as many times as the number corresponding to a designated filter order, in which filter algorithm each piece of coefficient data and each piece of input data are multiplied together and resultant products are summed up. The signal processing apparatus is provided, which can implement plural sorts of FIR filter algorithms of filter order which can be changed flexibly.

15 Claims, 16 Drawing Sheets

(51) Int. Cl.
  *G10H 7/12* (2006.01)
  *G10H 1/043* (2006.01)
  *H03H 17/02* (2006.01)
  *H03H 17/06* (2006.01)
  *G10H 1/12* (2006.01)

(52) U.S. Cl.
  CPC ....... *H03H 17/06* (2013.01); *G10H 2210/281* (2013.01); *G10H 2250/115* (2013.01); *G10H 2250/145* (2013.01)

(58) Field of Classification Search
  CPC ....... H03H 2017/0298; H03H 17/0009; G10K 2210/3028; G10H 2250/115; G10H 1/02; G10H 2250/095; G10H 1/12; G10H 2250/111
  See application file for complete search history.

(56) References Cited

U.S. PATENT DOCUMENTS

| | | | | |
|---|---|---|---|---|
| 5,536,902 A | * | 7/1996 | Serra | G10H 3/125 84/623 |
| 5,587,548 A | * | 12/1996 | Smith, III | G10H 5/007 84/622 |
| 5,777,249 A | * | 7/1998 | Suzuki | G10H 5/007 84/604 |
| 5,814,750 A | * | 9/1998 | Wang | G10H 1/125 84/602 |
| 8,653,354 B1 | * | 2/2014 | Van Buskirk | G10H 1/125 84/609 |
| 2002/0053275 A1 | * | 5/2002 | Ogawa | H04S 1/007 84/662 |
| 2005/0145099 A1 | * | 7/2005 | Lengeling | G10H 1/0066 84/645 |
| 2008/0202321 A1 | * | 8/2008 | Goto | G10H 1/361 84/616 |
| 2009/0025538 A1 | * | 1/2009 | Arimoto | G09B 15/00 84/605 |
| 2009/0107322 A1 | * | 4/2009 | Akiyama | G10H 1/0091 84/616 |

FOREIGN PATENT DOCUMENTS

| | | |
|---|---|---|
| JP | 2005215058 A | 8/2005 |
| JP | 2008299005 A | 12/2008 |

* cited by examiner

FIG. 6 conv(coef=[2 3 4 5 6 7 8 9], sig=[1 2 3 4 5 6 7 8 9 10]) = 2 7 16 30 50 77 112 156 200 244 266 275 270 250 214 161 90
ifft(fft(coef)*fft(sig))

| coef | data | | | | | | | | | | | | | | | | | |
|---|---|---|---|---|---|---|---|---|---|---|---|---|---|---|---|---|---|---|
| | | 2 | 7 | 16 | 30 | 50 | 77 | 112 | 156 | 200 | 244 | 266 | 275 | 270 | 250 | 214 | 161 | 90 |
| [0 0 2 3] | [0 0 1 2] | 2 | 7 | | | | | | | | | | | | | | | |
| | [1 2 3 4] | | 6 | 12 | 17 | 14 | 7 | | | | | | | | | | | |
| | [3 4 5 6] | | | | | 22 | 27 | 24 | 17 | | | | | | | | | |
| | [5 6 7 8] | | | | | | | 32 | 37 | 34 | 27 | | | | | | | |
| | [7 8 9 10] | | | | | | | | | 42 | 47 | 44 | 37 | 30 | 18 | 47 | | |
| | [9 10 0 0] | | | | | | | | | | | | | 0 | 0 | | | |
| [0 0 4 5] | [0 0 1 2] | | | 4 | 13 | 10 | 0 | | | | | | | | | | | |
| | [1 2 3 4] | | | | | 22 | 31 | 24 | 13 | | | | | | | | | |
| | [3 4 5 6] | | | | | | | 40 | 49 | 42 | 31 | | | | | | | |
| | [5 6 7 8] | | | | | | | | | 58 | 67 | 60 | 49 | | | | | |
| | [7 8 9 10] | | | | | | | | | | | 76 | 85 | 78 | 67 | | | |
| | [9 10 0 0] | | | | | | | | | | | | | 50 | 0 | 36 | 85 | |
| [0 0 6 7] | [0 0 1 2] | | | | | 6 | 19 | 14 | 0 | | | | | | | | | |
| | [1 2 3 4] | | | | | | | 32 | 45 | 34 | 19 | | | | | | | |
| | [3 4 5 6] | | | | | | | | | 58 | 71 | 60 | 45 | | | | | |
| | [5 6 7 8] | | | | | | | | | | | 84 | 97 | 86 | 71 | | | |
| | [7 8 9 10] | | | | | | | | | | | | | 110 | 123 | 112 | 97 | |
| | [9 10 0 0] | | | | | | | | | | | | | | | 70 | 0 | 54 | 123 |
| [0 0 8 9] | [0 0 1 2] | | | | | 8 | 25 | 18 | 0 | | | | | | | | | |
| | [1 2 3 4] | | | | | | | 42 | 59 | 44 | 25 | | | | | | | |
| | [3 4 5 6] | | | | | | | | | 76 | 93 | 78 | 59 | | | | | |
| | [5 6 7 8] | | | | | | | | | | | 110 | 127 | 112 | 93 | | | |
| | [7 8 9 10] | | | | | | | | | | | | | 144 | 161 | 146 | 127 | |
| | [9 10 0 0] | | | | | | | | | | | | | | | 90 | 0 | 72 | 161 |

2N
VARIABLE PART
(FIR FILTER
ALGORITHM)

THE OTHER PART (CONV ALGORITHM)

SIGNAL PROCESSING APPARATUS

CROSS-REFERENCE TO RELATED APPLICATION

The present application is based upon and claims the benefit of priority from the prior Japanese Patent Application No. 2017-049459, filed Mar. 15, 2017, the entire contents of which are incorporated herein by reference.

BACKGROUND OF THE INVENTION

1. Field of the Invention

The present invention relates to a signal processing apparatus which processes a signal by using a finite impulse response (FIR) filter, a method of implementing a filter algorithm, and an effect applying apparatus using the filter algorithm.

2. Description of the Related Art

In reverberation effect applying apparatuses which apply reverberation and/or resonance effect on an original tone of an audio signal by convoluting the original tone of an audio signal with an impulse response, a technology using an FIR filter to implement convolution in a time domain is known as a technique for convoluting the original tone of an audio signal with such effects (Refer to Japanese Unexamined Patent Publication No. 2003-280675), and a technology using a Fast Fourier Transform (FFT)/inverse Fast Fourier Transform (iFFT) is known as a technique of implementing convolution in a frequency domain. (Refer to Japanese Unexamined Patent Publication No. 2005-215058)

A hybrid method using both FIR and FFT is known to use FIR algorithm to convolute the audio sound with first reflection sound and to use FFT algorithm to convolute the audio sound with reverberation sound. (Refer to William G. Gardner "Efficient Convolution without Input-Output Delay", J. Audio Eng. Soc., Vol. 43 No. 3, p. 127, 1995 March.)

SUMMARY OF THE INVENTION

According to one aspect of the present invention, there is provided a signal processing apparatus which comprises a first memory in which plural pieces of coefficient data used for implementing a filter algorithm are stored, and a processor which receives plural pieces of input data to be subjected to the filter algorithm, executes the filter algorithm using the plural pieces of coefficient data stored in the first memory and the plural pieces of received input data as many times as the number corresponding to a designated filter order, and outputs an execution result of the filter algorithm, in which filter algorithm each piece of coefficient data and each piece of input data are multiplied together and resultant products are summed up.

According to another aspect of the present invention, there is provided a method for implementing filter algorithm comprising the steps of: reading coefficient data successively from a first memory which stores plural pieces of coefficient data to be used in the filter algorithm; successively receiving plural pieces of input data to be subjected to the filter algorithm; designating a filter order of the filter algorithm; implementing the filter algorithm repeatedly on the coefficient data read successively from the coefficient storing unit and the successively received input data as many times as the number corresponding to the designated filter order, in which algorithm each piece of coefficient data and each piece of input data are multiplied together and resultant products are summed up; and outputting a result of implementing the filter algorithm.

BRIEF DESCRIPTION OF THE DRAWINGS

FIG. 6 is a view showing an example of simple calculation for explaining the operation of a CONV algorithm implementing unit shown in FIG. 3.

DETAILED DESCRIPTION OF THE PREFERRED EMBODIMENTS

Now, embodiments of the present invention will be described with reference to the accompanying drawings in detail. In a signal processing apparatus employed in an effect applying unit of an electronic musical instrument according to the present embodiment of the invention, an FIR (finite impulse response) filter algorithm can be implemented, the filter order of which is changed flexibly, and also plural FIR filter algorithms having different filter order and different impulse response are combined flexibly and can be implemented simultaneously. In the effect applying unit of the electronic musical instrument according to the present embodiment of the invention, convolution in the time domain implemented by FIR filter algorithm and the convolution in the frequency domain using Fast Fourier Transform (FFT) are implemented in combination. In this case, since FFT point numbers in the convolution in the frequency domain can be determined flexibly together with the filter order of the FIR filter, it will be possible for the effect applying unit to add reverberation effect and resonance effect of an enhanced reproducibility to musical tones of the electronic musical instrument without sacrificing responsiveness of the electronic musical instrument.

Figure 1:
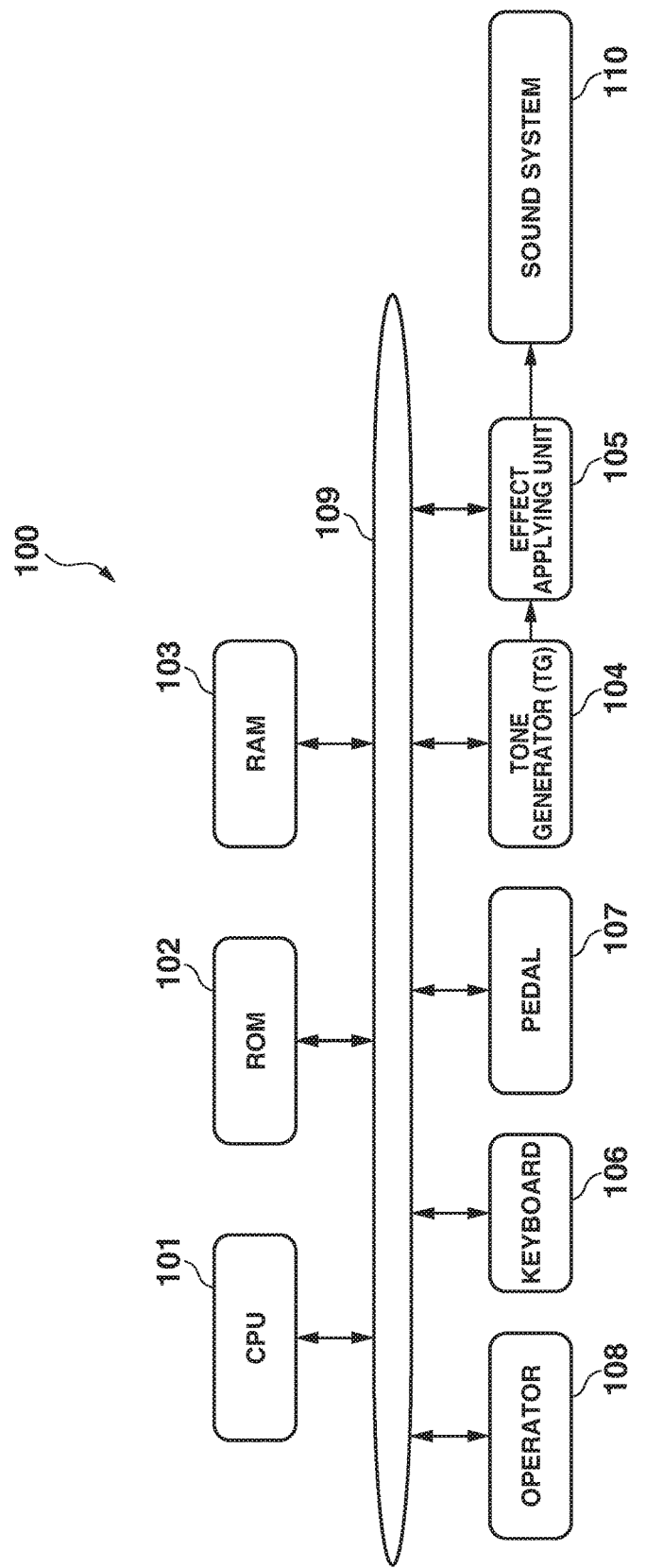
FIG. 1 is a block diagram showing an example of the configuration of an electronic musical instrument according to the present invention.

FIG. 1 is a block diagram showing an example of the configuration of the electronic musical instrument 100 according to the present invention.

The electronic musical instrument 100 comprises CPU (Central Processing Unit) 101, ROM (Read Only Memory) 102, RAM (Random Access Memory) 103, TG (a tone generator) 104, the effect applying unit 105, a keyboard 106, a pedal 107, and an operator 108. These elements are connected to each other through a system bus 109. An output of the tone generator TG 104 is supplied to a sound system 110.

The CPU 101 executes a control program read on the RAM 103 from the ROM 102 and gives an instruction (tone generation instruction) to the tone generator TG 104 to generate a tone based on performance information sent from the keyboard 106 and the operator 108.

The tone generator TG 104 reads waveform data from the ROM 102 and/or the RAM 103 in accordance with the tone generation instruction to produce musical tone data. The musical tone data is supplied to the sound system. 110 through the effect applying unit 105. For instance, when the pedal 107 is pressed, the effect applying unit 105 adds effects such as reverberation effect and resonance effect such as piano string vibration to the musical data. Finally, the musical tone data supplied from the effect applying unit 105 to the sound system 110 is converted into an analog musical tone signal by an analog/digital convertor. The converted analog signal is amplified in an amplifier and is output from a speaker.

Figure 2:
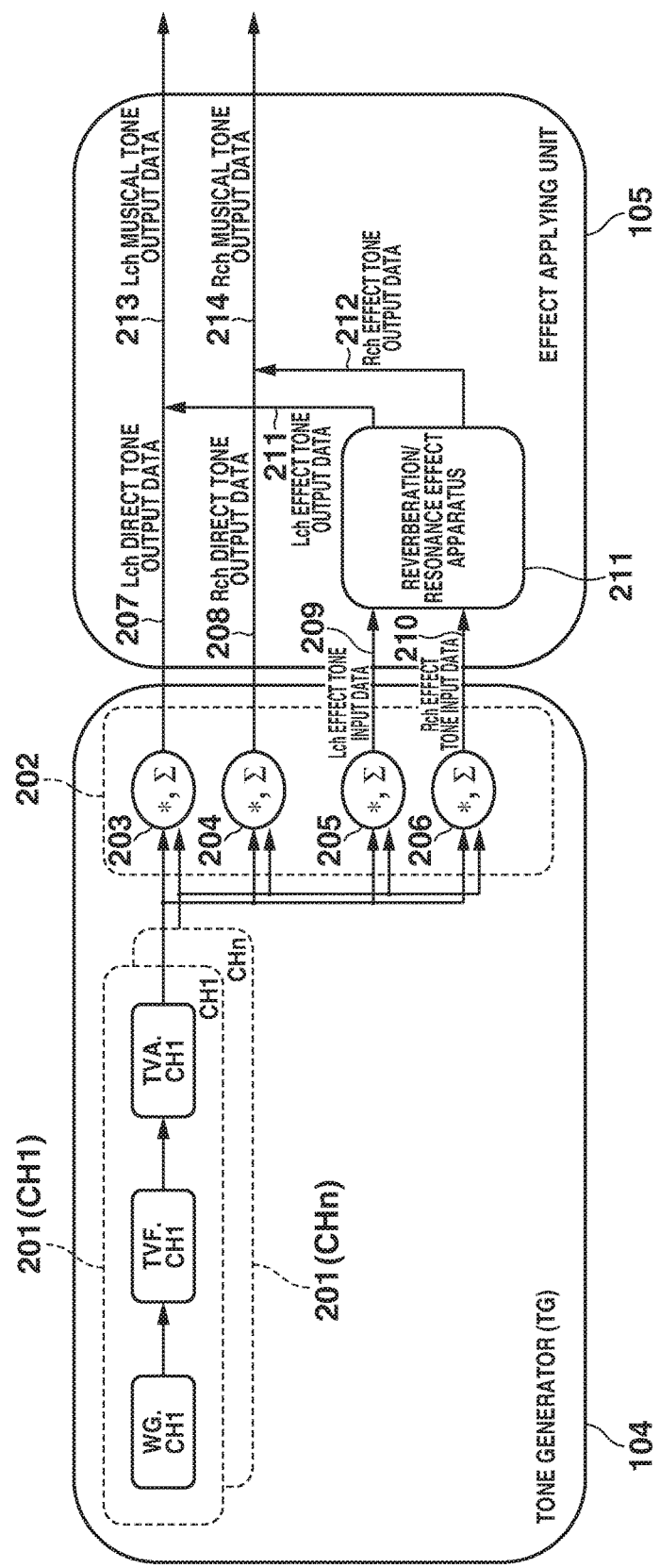
FIG. 2 is a view showing an example of a flow of musical tone data in the electronic musical instrument having the configuration shown in FIG. 1.

FIG. 2 is a view showing an example of a flow of the musical tone data in the electronic musical instrument 100 having the configuration shown in FIG. 1.

The tone generator TG 104 is provided with musical tone generating units 201 (CH1) to 201 (CHn), which generate "n" pieces of musical tone data respectively for "n" musical tone channels CH1 to CHn. Each musical tone generating unit 201 produces musical tone data independently of other musical tone data produced by other musical tone generating unit 201, in accordance with the tone generation instruction which is generated in response to pressing operation on the keyboard 106 and supplied from the CPU 101 (FIG. 1).

The musical tone generating unit 201 (CHi) ($1 \leq i \leq n$) corresponding to the musical tone channel Chi is provided with a waveform generation unit WG.CHi for generating waveform data, a filtering unit TVF.Chi for processing a timbre of the generated waveform data, and an amplitude envelope processing unit TVA.CHi for processing an amplitude envelope of the generated waveform data.

Four mixers 203, 204, 205 and 206 in a mixing unit 202 multiply the respective pieces of musical tone data output from the musical tone generating units 201 (CHi) ($1 \leq i \leq n$) by prescribed levels and accumulate the resultant products, thereby outputting an Lch (left channel) direct tone output data 207, a Rch (right channel) direct tone output data 208, an Lch (left channel) effect tone input data 209, and a Rch (right channel) effect tone input data 210 to the effect applying unit 105. The symbol "$\ast \cdot \Sigma$" in the mixers 203, 204, 205 and 206 shown in FIG. 2 means that the mixer multiplies the input data by a prescribed level and accumulates the products to output the data.

The Lch effect tone input data 209 and the Rch effect tone input data 210 are given reverberation and resonance effects respectively in a reverberation/resonance effect apparatus 211 of the effect applying unit 105 and are output as Lch effect tone output data 211 and Rch effect tone output data 212, respectively. The Lch effect tone output data 211 is added to the Lch direct tone output data 207 in the effect applying unit 105 and is output as Lch musical tone output data 213 to the sound system 110 shown in FIG. 1. Similarly, the Rch effect tone output data 212 is added to the Rch direct tone output data 208 in the effect applying unit 105 and is output as Rch musical tone output data 214 to the sound system 110 shown in FIG. 1. In the sound system 110, the Lch musical tone output data 213 and the Rch musical tone output data 214 are converted to an Lch analog musical tone signal and a Rch analog musical tone signal, respectively, and are amplified and output from an Lch speaker and a Rch speaker, respectively.

Figure 3:
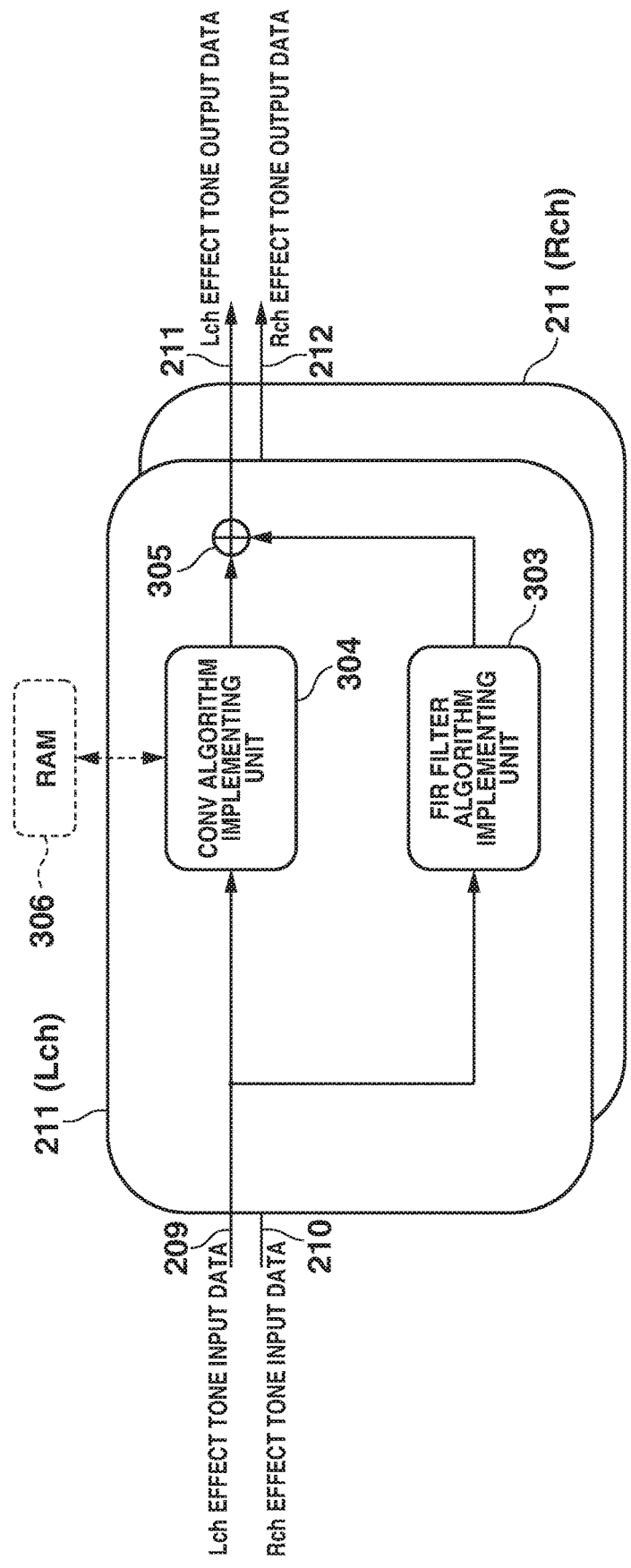
FIG. 3 is a block diagram showing a configuration of the reverberation/resonance effect unit in an effect applying unit shown in FIG. 2.

FIG. 3 is a block diagram showing a configuration of the reverberation/resonance effect apparatus 211 in the effect applying unit 105 shown in FIG. 2. The reverberation/resonance effect apparatus 211 has a reverberation/resonance effect apparatus 211(Lch) and a reverberation/resonance effect apparatus 211(Rch). The reverberation/resonance effect apparatus 211(Lch) receives the Lch effect tone input data 209 and adds Lch reverberation and resonance effect to the input data 209 to output Lch effect tone output data 211. Similarly, the reverberation/resonance effect apparatus 211(Rch) receives the Rch effect tone input data 210 and adds Rch reverberation and resonance effect to the input data 210 to output Rch effect tone output data 212. Since both channels have the same configuration, where the Left channel and/or the Right channel are not referred to directly, the description will be given hereinafter without distinction of the Left channel and the Right channel.

The Lch effect tone input data 209 or the Rch effect tone input data 210 received by the reverberation/resonance effect apparatus 211 is supplied to an FIR filter algorithm implementing unit 303 and a CONV algorithm implementing unit 304 in parallel.

The FIR filter algorithm implementing unit 303 is a time domain convolution implementing unit which implements convolution in the time domain in unit of sampling period to convolute the Lch effect tone input data (original tone) 209 or the Rch effect tone input data (original tone) 210 with a first half of the impulse response data of a reverberation/resonance tone.

The CONV algorithm implementing unit 304 is a frequency domain convolution implementing unit which implements convolution in the frequency domain using a Fast Fourier Transform (FFT) with unit of block to convolute the Lch effect tone input data (original tone) 209 or the Rch effect tone input data (original tone) 210 with a second half of the impulse response data of the reverberation/resonance tone. The FIR filter algorithm implementing unit 303 and the CONV algorithm implementing unit 304 use RAM 306 installed in the effect applying unit 105 (shown in FIG. 2), that is, DSP as a common area to implement the algorithm.

The outputs from the FIR filter algorithm implementing unit 303 and the CONV algorithm implementing unit 304 are added together in an adding unit 305, and are output as the Lch effect tone output data 211 or the Rch effect tone output data 212, respectively.

Figure 4:
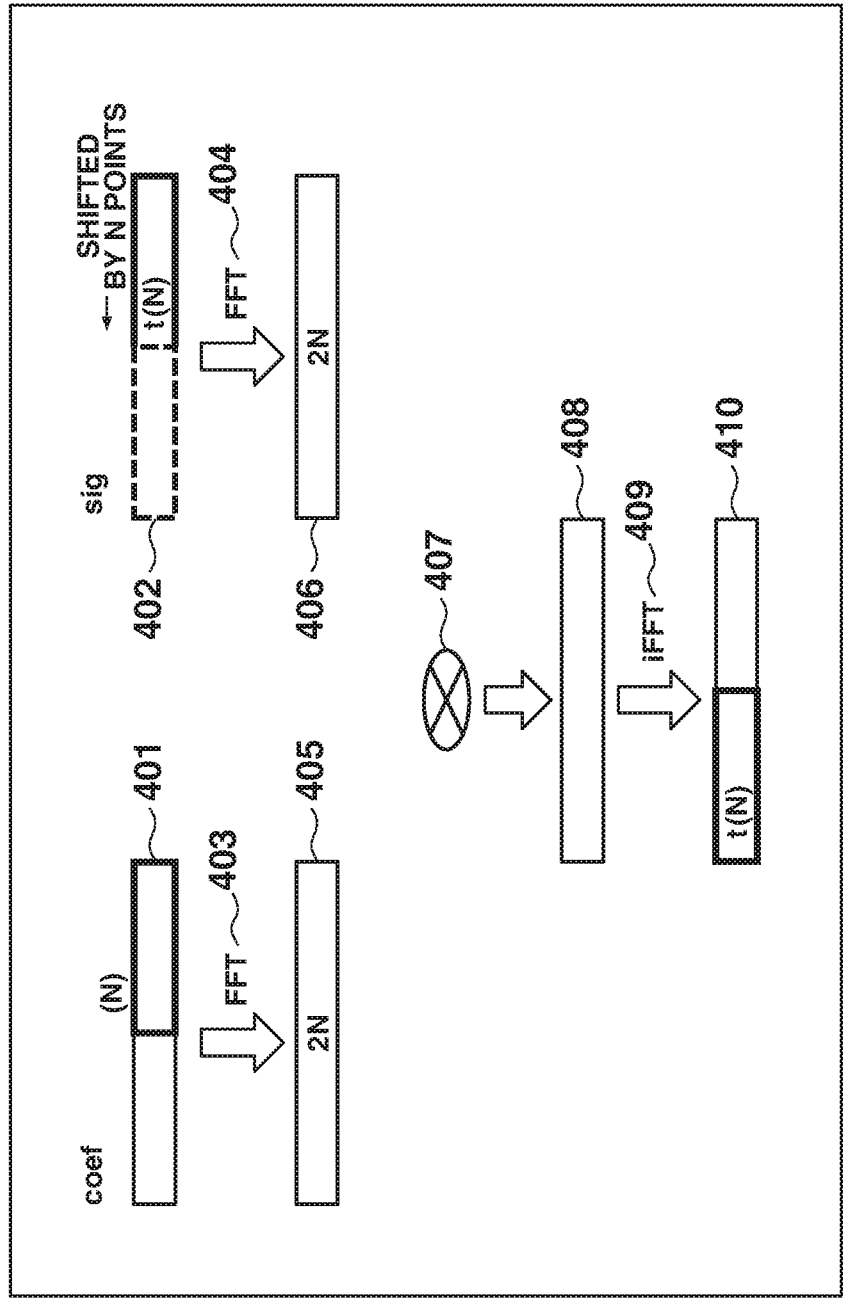
FIG. 4 is a view showing an example of the convolution algorithm which is implemented when a block size is N points.
Figure 5:
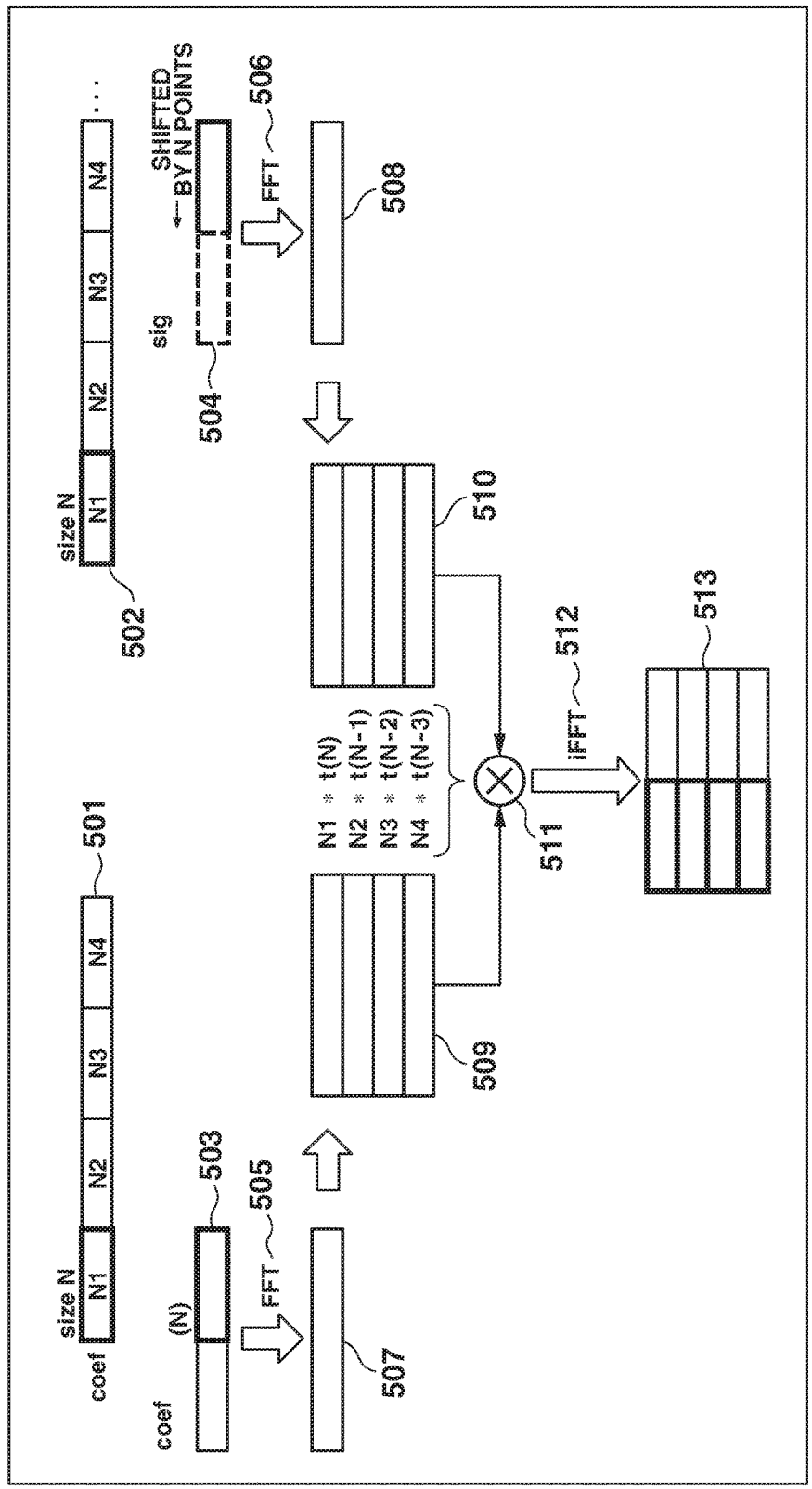
FIG. 5 is a view showing an example of the convolution of the block size of N points performed where the impulse response data (coef) is divided into plural pieces of data a block size of N points.

FIG. 4 to FIG. 6 are views for explaining the operation of the CONV algorithm implementing unit 304 shown in FIG. 3. FIG. 4 is a view showing an example of the convolution algorithm which is computed when a block size is N points. Since the convolution using the FFT algorithm is itself circular convolution, when the FFT algorithm of 2N points is implemented on the impulse response data (coef) and the Lch effect tone input data 209 or the Rch effect tone input data 210, linear convolution of each block will be obtained in the present embodiment.

Hereinafter, the Lch effect tone input data 209 and the Rch effect tone input data 210 will be collectively referred to as the "effect tone input data (sig)".

In this case, prior to implementing the FFT algorithms 403, 404 of 2N points, the impulse response data (coef) of N points (in bold line in FIG. 4) as indicated by 401 is added with zero data of N points, whereby data of 2N points is produced. Meanwhile, the effect tone input data (sig) is shifted by a block size of N points to overlap (bold line to broken bold line), as indicated by 402, whereby data of 2N points is produced. As a result of the FFT algorithms 403, 404 implemented respectively on the data 401 of 2N points produced from the impulse response data (coef) and the data 402 of 2N points produced from the effect tone input data (sig), the data 405, 406 of 2N points in the frequency domain are produced.

The data 405, 406 of 2N points in the frequency domain are subjected to complex multiplication on each frequency point, as indicated by 407, whereby complex multiplication data 408 of 2N points is produced.

Further, when iFFT algorithm is implemented on the complex multiplication data 408 of 2N points, as indicated by 409, data 410 of 2N points in the time domain, which has been subjected to convolution, is produced.

The first half data (bold line) of N points out of the time domain data 410 of 2N points results from a linear convolution by the over-lap method of a block size of N points and data of the block size of N points produced successively in this way are output as the Lch effect tone output data 211 or the Rch effect tone output data 212 shown in FIG. 3.

FIG. 5 is a view showing an example of the convolution of the block size of N points which is performed where the impulse response data (coef) is also divided into plural pieces of data of a block size of N points. In this example, a sum of convolutions of N points allows to divide the impulse response of a long time into short blocks of N points to implement convolution algorithm.

As shown in the example of FIG. 5, the impulse response data (coef) is divided into plural pieces of divided data N1, N2, N3 and N4, indicated by 501, each of which has a block size of N points. Further, the effect tone input data (sig) is divided into plural pieces of divided data N1, N2, N3 and N4, as indicated by 502, each of which has a block size of N points.

In the similar manner to the convolution implemented, as illustrated in FIG. 4, prior to implementing the FFT algorithms 505, 506 of 2N points, the divided data (in bold line) of N points in the impulse response data (coef) is added with zero data of N points, whereby data of 2N points is produced. Meanwhile, the effect tone input data (sig) is shifted by the divided block size of N points to overlap (bold line to broken bold line), as indicated by 504, whereby data of 2N points is produced. As a result of the FFT algorithms 505, 506 implemented respectively on the data 503 of 2N points produced from the divided data of N points of the impulse response data (coef) and the data 504 of 2N points produced from the effect tone input data (sig), the data 507, 508 of 2N points in the frequency domain are produced and further successively produced, as shown by 509, 510. Frequency data group 509 of 2N points (N1, N2, N3, N4) produced from the divided data N1, N2, N3, N4 (501 in FIG. 5) of the impulse response data (coef) is subjected to the FFT algorithm and can be preset in a memory, as far as the impulse response data (coef) does not change. Meanwhile, frequency data group 510 of 2N points produced from the effect tone input data (sig) can be successively stored in the memory in a ring buffer manner such as t(N), t(N−1), t(N−2), t(N−3) as many as the number of divided data N1, N2, N3, N4 of the impulse response data (coef).

The frequency data group 509 (N1, N2, N3, N4) and the frequency data group 510 t(N), t(N−1), t(N−2), t(N−3) are subjected to complex multiplication at each frequency point of 2N points to produce complex multiplication data of 2N points N1 ∗ t(N), N2 ∗ t(N−1), N3 ∗ t(N−2), N4 ∗ t(N−3). Further, iFFT algorithm is implemented on the complex multiplication data N1 ∗ t(N), N2 ∗ t(N−1), N3 ∗ t(N−2), N4 ∗ t(N−3) to produce time domain data group 513 of 2N points.

The first half data (bold line) of N points of each piece of time domain data 513 of 2N points is output as the Lch effect tone output data 211 or the Rch effect tone output data 212, shown in FIG. 3.

FIG. 6 is a view showing an example of simple calculation for explaining the operation of the CONV algorithm implementing unit 304 shown in FIG. 3.

For instance, when
conv(coef=[2 3 4 5 6 7 8 9]
sig=[1 2 3 4 5 6 7 8 9 10])
is calculated with a block size of N=2, 9th convolution result=200 and 10th convolution result=244 are obtained. These convolution results can be calculated by summing up the first halves of the calculation results of $$\mathrm{ifft}(\mathrm{fft}([0023]) * \mathrm{fft}([78910]))$$

$$\mathrm{ifft}(\mathrm{fft}([0045]) * \mathrm{fft}([5678]))$$

$$\mathrm{ifft}(\mathrm{fft}([0067]) * \mathrm{fft}([3456])) \text{ and}$$

$$\mathrm{ifft}(\mathrm{fft}([0089]) * \mathrm{fft}([1234])), \text{ where}$$

"fft( )" means to implement the FFT algorithm on data group in parentheses and "ifft( )" means to implement the iFFT algorithm on data group in parentheses.

Figure 7:
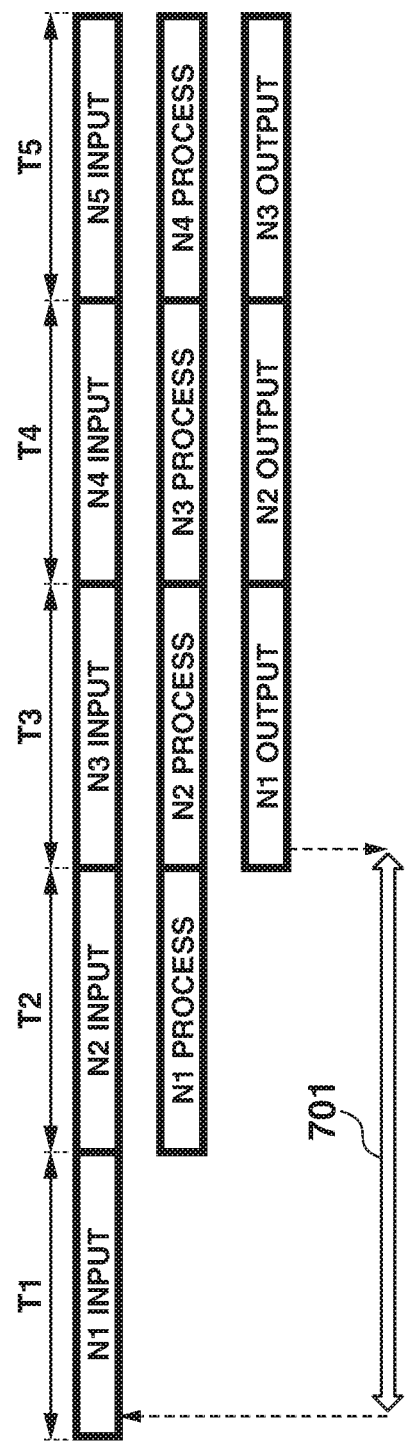
FIG. 7 is a view for explaining a delay in the frequency domain convolution implemented by using a FFT algorithm.

As shown in the above example, the linear convolution using the FFT algorithm can be implemented, but since the FFT algorithm is performed in unit of block, implementation is delayed at the beginning of the block. FIG. 7 is a view for explaining a delay in the frequency domain convolution implemented using the FFT algorithm.

For example as illustrated in FIG. 7, in a block interval T1, data of a block N1 is input. In the next block interval T2, data of a block N2 is input and the convolution (FFT algorithm, complex multiplication, and iFFT algorithm) is implemented on the data of a block N1. Further, in the block interval T3, data of a block N3 is input and the convolution is implemented on the data of a block N2, and the data of a block N1 is output. In the block interval T4, data of a block N4 is input, the convolution is implemented on the data of a block N3, and the data of a block N2 is output. In the block interval T5, data of a block N5 is input, the convolution is implemented on the data of a block N4, and the data of a block N3 is output.

As will be understood from the "timing" illustrated in FIG. 7, a delay of 2N is caused for the block size of N points in the linear convolution using the FFT algorithm indicated by 701. Therefore, the FIR filter algorithm implementing unit 303 of the filter order of 2N is provided in the reverberation/resonance effect apparatus 211 shown in FIG. 3 to compensate the delay of 2N caused in the operation implemented by the CONV algorithm implementing unit 304.

Figure 8:
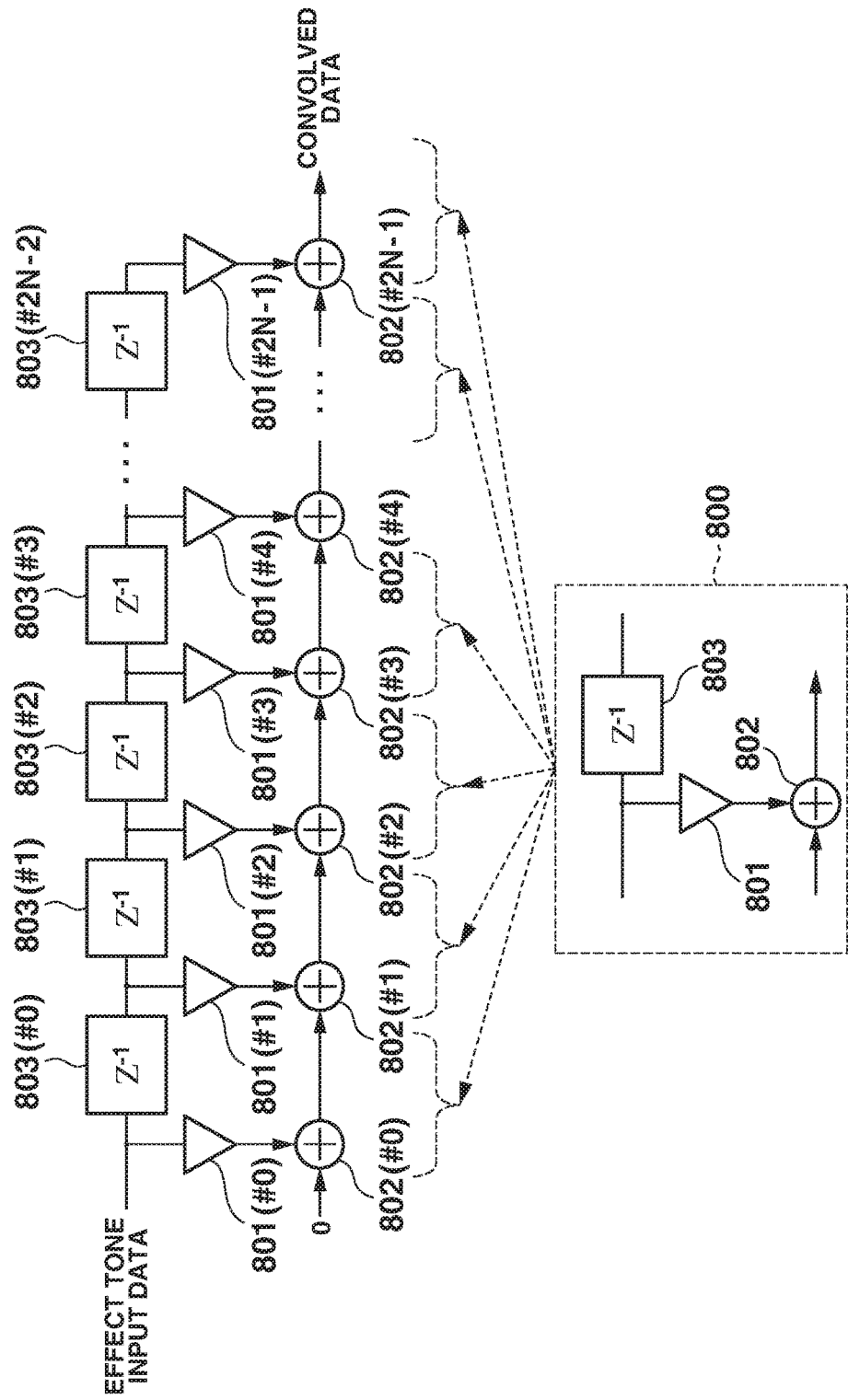
FIG. 8 is a block diagram of a configuration of functions of a FIR filter algorithm implementing unit.

FIG. 8 is a block diagram of a configuration of functions of the FIR filter algorithm implementing unit 303. As shown in FIG. 8, a primary filter algorithm implementing unit 800 comprises a multiplication unit 801, an accumulation unit 802, and a delay processing unit 803. The primary filter algorithm implementing units 800 are connected in cascade from #0 to #2N−1, which composes a direct configuration type FIR filter of filter order=2N. The filter algorithm implementing unit 800 in the last stage #2N−1 has no delay processing unit 803.

More specifically, the effect tone input data (the Lch effect tone input data 209 or the Rch effect tone input data 210 in FIG. 3) is multiplied by the 0-th order FIR coefficient data in the 0-th order multiplication unit 801(#0), and the calculated multiplication data is accumulated on the data accumulated at the prior stage (data of "0" since there is no prior order multiplication unit 801) by the 0-th order accumulation unit 802(#0). Meanwhile, the effect tone input data is delayed by one sampling period in the 0-th delay processing unit 803(#0).

The output of the 0-th delay processing unit 803(#0) is multiplied by the first order FIR coefficient data in the first order multiplication unit 801(#1), and the calculated multiplication data is accumulated on the data accumulated at the prior stage, that is, at the 0-th order accumulation unit 802(#0) in the first order accumulation unit 802(#1). Meanwhile, the data output from the 0-th delay processing unit 803(#0) is delayed by one sampling period in the first order delay processing unit 803(#1).

Thereafter, the FIR algorithms are similarly implemented at the stages from the 0-th order to the (2N−1)-th order. In general, the output (when i=0, the effect tone input data) of the i-th (0≤i≤2N−1) order FIR algorithm delay processing unit 803(#i−1) is multiplied by the i-th order FIR coefficient data in the i-th order multiplication unit 801(#i), and the calculated multiplication data is accumulated on the data (when i=0, data of "0") accumulated at the prior stage, that is, at the (i−1)-th order accumulation unit 802(#i−1) in the i-th order accumulation unit 802(#i). Meanwhile, the data (when i=0, the effect tone input data) output from the (i−1)-th delay processing unit 803(#0) is delayed by one sampling period in the first delay processing unit 803(#i).

The accumulated data at the final stage, that is, at the (2N−1)-th order accumulation unit 802(#2N−1) is output as convolved data. The (2N−1)-th order delay processing unit 803(#2N−1) is not required.

In the FIR filter algorithm implementing unit 303 having the configuration of functions as shown in FIG. 3, the delay processing units 803(#0)-803(#2N−2) successively store the effect tone input data in the memory of a ring buffer type.

The effect tone input data is processed in unit of sampling period by the mixer 205 or 206 in the mixing unit 202 of the tone generator TG 104 (FIG. 2).

The multiplication unit 801 and the accumulation unit 802 implement the FIR algorithm in synchronism with a clock of a cycle subdividing the sampling period. The calculation of the FIR algorisms at all the orders will finish within the sampling period and the convolved data will be output from the final stage, that is, from the (2N−1)-th order accumulation unit 802(#2N−1) within the sampling period, too. Therefore, there is no delay occurred in the convolution implemented by the FIR filter algorithm implementing unit 303 shown in FIG. 3.

If the filter order of the FIR filter algorithm implementing unit 303 is equivalent to an FFT size (twice of the block size N) of the CONV algorithm implementing unit 304, a time lag (refer to FIG. 7) in the operation of the CONV algorithm implementing unit 304 will give little influence on the delay in the convolution implemented by the FIR filter algorithm implementing unit 303.

Now, it is assumed that the first 2N samples of the effect tone input data is input to the FIR filter algorithm implementing unit 303 and at the same time 2N samples of the effect tone input data shifted by N samples are successively input to the CONV algorithm implementing unit 304.

Figure 9:
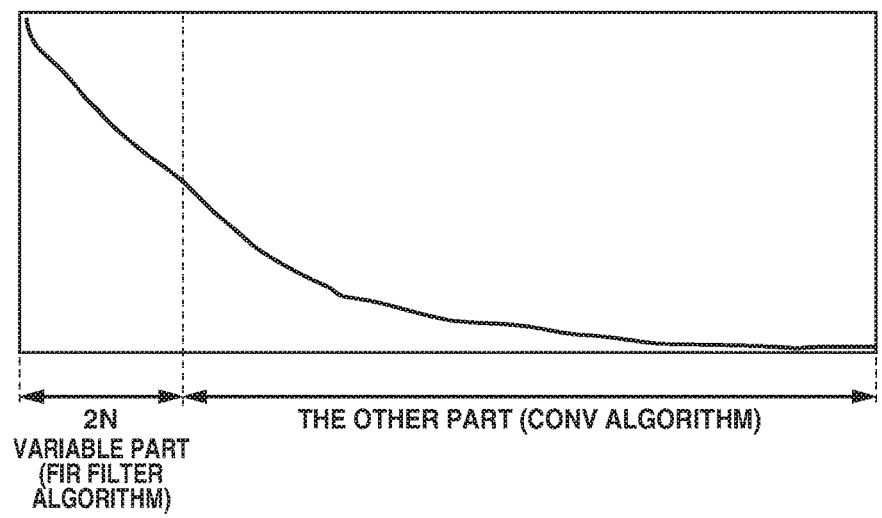
FIG. 9 is a view for explaining a relationship between operations implemented by the FIR filter algorithm implementing unit and the CONV algorithm implementing unit.

FIG. 9 is a view for explaining a relationship between operations implemented by the FIR filter algorithm implementing unit 303 and the CONV algorithm implementing unit 304. As shown in FIG. 9, the FIR filter algorithm implementing unit 303 convolutes the first 2N samples of the effect tone input data with the first 2N samples of the impulse response data of a reverberation tone or resonance tone every sampling period to obtain convolved data of 2N samples, and outputs the convolved data of 2N samples every sampling period without delay. Meanwhile, the CONV algorithm implementing unit 304 receives effect tone input data overlapped by N samples and convolutes in the frequency domain the every 2N samples of the received data with (N samples+N samples of a value "0") (=2N samples) of impulse response data of the reverberation or resonance tone which follow the (2N+1)-th sample to obtain convolved data of N samples. The convolved data of N samples obtained in this way are successively output with delay of 2N samples. Therefore, after the FIR filter algorithm implementing unit 303 outputs the first 2N samples of convolved data, when the adding unit 305 of FIG. 3 receives the convolved data of N samples sent from the CONV algorithm implementing unit 304 and successively outputs the received data every sampling period, it will be possible for the reverberation/resonance effect unit 211 shown in FIG. 3 to output the effect tone output data (Lch effect tone output data 211 or the Rch effect tone output data 212) which is obtained by convoluting the whole effect tone input data with the impulse response data, without any delay.

Although the FIR filter algorithm implementing unit 303 implements operation every sampling period, many electronic musical instruments have plural types of reverberation effect and when convolution is implemented with these types of reverberation effect, the impulse response will be of various durations. The reverberation or body response effect of the musical instrument will vary depending on the size of the musical instrument. Therefore, it is not preferable to fix a block size in the configuration generating little delay in operation, that is, for instance it is not preferable to fix the block size based on the impulse response having the longest duration.

In the present embodiment, since the reverberation/resonance effect units 211 are prepared respectively for the Lch (left channel) effect tone input data 209 and the Rch (right channel) effect tone input data 210, it is required to prepare at least two reverberation/resonance effect units 211 in the FIR filter algorithm implementing unit 303.

The FIR filter algorithm implementing unit 303 having a configuration to be explained hereinafter can calculate the FIR filter algorithm of the filter order which is changed flexibly, and further can combine and implement plural FIR algorithms flexibly at the same time.

Figure 10:
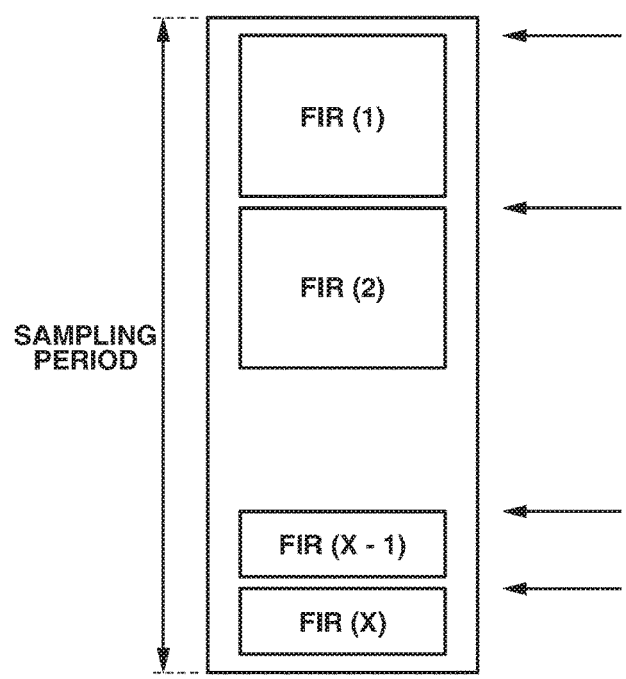
FIG. 10 is a view for explaining the FIR filter algorithm implementing unit which can implement FIR filter algorithms in plural systems in a sampling period.

FIG. 10 is a view for explaining the FIR filter algorithm implementing unit 303 which can implement FIR filter algorithms in plural channels in a sampling period. In FIG. 10, FIR(1), FIR(2), . . . , FIR(X−1), and FIR(X) indicate FIR filter algorithm implementing units, respectively. In the present embodiment, a single FIR filter algorithm implementing unit implements the FIR filter algorithm by time division processing, thereby performing filter algorithm implementing functions and these functions correspond respectively to the FIR filter implementing units 303 for the Lch (left channel) and the Rch (right channel) and other FIR filter algorithm implementing units (not shown). In the present embodiment, each of the FIR filter algorithm implementing units FIR(1), FIR(2), . . . , FIR(X−1), and FIR(X) implements the FIR filter algorithm of the filter order (explained in FIG. 8) by time division processing of a time length corresponding to the filter order. At this time, the CPU 101 working as the controlling unit (FIG. 1) assigns the FIR filter algorithm implementing units FIR(1), FIR(2), . . . , FIR(X−1), and FIR(X) with continuous time durations, respectively, which are counted by a clock having a cycle subdividing the sampling period and are long (the number of clocks) enough for implementing the FIR filter algorithm of the given filter order. In the continuous time durations the DSP (Digital Signal Processor) of the effect applying unit 105 implements the FIR filter algorithms of respective filter orders.

Figure 11:
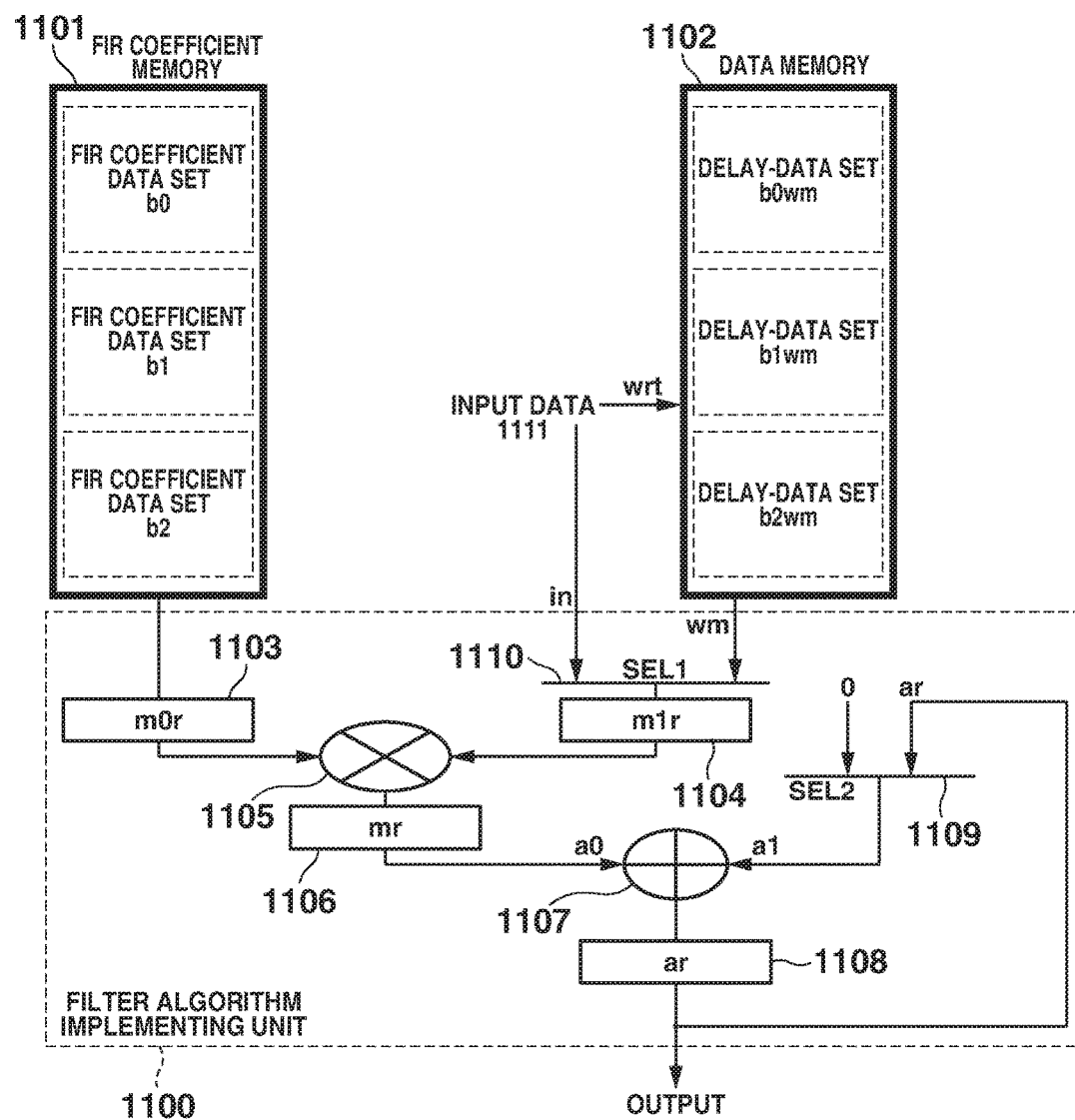
FIG. 11 is a view showing a hardware configuration of an FIR filter algorithm implementing unit which implements the above time division process to realize the FIR filter algorithm implementing units 303 for the Lch (left channel) and the Rch (right channel).

FIG. 11 is a view showing a hardware configuration of an FIR filter algorithm implementing unit which performs the above time division processing to realize the FIR filter algorithm implementing units 303 for the Lch (left channel) and the Rch (right channel).

An FIR coefficient memory 1101 stores plural FIR coefficient data sets corresponding to the order of filter order, for each of the FIR filter algorithm implementing units of variable filter order FIR(1), FIR(2), . . . , FIR(X−1), and FIR(X).

In the FIR coefficient memory 1101 shown in FIG. 11, for instance, three FIR coefficient data sets b0, b1, and b2 are stored for each of the FIR filter algorithm implementing units FIR(1), FIR(2), and FIR(3). The number of coefficients in each of the stored FIR coefficient data sets b0, b1, and b2 corresponds to the filter orders of the corresponding FIR filter algorithm implementing unit among FIR(1), FIR(2), and FIR(3).

More specifically, for example, it is assumed that the FIR filter algorithm implementing units FIR (1) and FIR (2) are the FIR filter algorithm implementing units 303 in the reverberation/resonance effect unit 211 (Lch) for processing the Lch effect tone input data 209 and the FIR filter algorithm implementing units 303 in the reverberation/resonance effect unit 211 (Rch) for processing the Rch effect tone input data 210, respectively. The FIR coefficient data set "b1" stored in the FIR coefficient memory 1101 is the first 2N data set of impulse response data of the Lch reverberation/resonance tone. Similarly, the FIR coefficient data set "b2" stored in the FIR coefficient memory 1101 is the first 2N data set of impulse response data of the Rch reverberation/resonance tone.

In a data memory 1102 (a storing unit for storing input data) shown in FIG. 11, storing areas of a ring buffer type are secured for (filter order−1) addresses for each of the FIR filter algorithm implementing units FIR(1), FIR(2), . . . , FIR(X−1), and FIR(X). In each storing area an input data set 1111 from the last sample to the sample before (filter order−1)-th sample for each of the FIR filter algorithm implementing units FIR(1), FIR(2), FIR (X−1), and FIR (X) is stored as a delay-data set.

In the data memory (input data storing unit) 1102 shown in FIG. 11 three storing areas of a ring buffer type are secured for (filter order−1) addresses of each of the FIR filter algorithm implementing units FIR(1), FIR(2), and FIR(3). In the storing areas the delay-data sets b0wm, b1wm, and b2wm are stored respectively. In each storing area a writing address is successively incremented from the leading address of storing area every sampling period and the input data 1111 in each sampling period is successively written on the incremented address. When the incremented address reaches the tail address of the storing area, the writing address return to the leading address to continue receiving the input data. In this manner plural pieces of delay-data from the last sample to the sample before (filter order−1)-th sample are written in a ring on the storing areas. As will be described later, the plural pieces of delay-data from the last sample to the sample before (filter order−1)-th sample are read from the storing areas in synchronism with a clock faster than the sampling clock having a cycle subdividing the sampling period.

For instance, assuming that the FIR(1) is the Lch FIR filter algorithm implementing unit 303 in the reverberation/ resonance effect unit 211 (Lch), the input data 1111 to the FIR(1) is the Lch effect tone input data 209. Further, assuming that a sample value of the Lch effect tone input data 209 in the current sample period is b1in, the Lch effect tone input data 209 from a sample value b1wm (1) in the last sampling period to a sample value b1wm(2N−1) in the period before (2N−1) sampling period is stored as delay-data set b1wm in the storing area of data memory 1102 corresponding to the FIR(1).

Similarly, assuming that the FIR(2) is the Rch FIR filter algorithm implementing unit 303 in the reverberation/resonance effect unit 211 (Rch), the input data 1111 to the FIR(2) is the Rch effect tone input data 210. Further, assuming that a sample value of the Rch effect tone input data 210 in the current sample period is b2in, the Rch effect tone input data 210 from a sample value b2wm(1) in the last sampling period to a sample value b2wm(2N−1) in the period before (2N−1) sampling period is stored as delay-data set b2wm in the storing area of data memory 1102 corresponding to the FIR(2).

Further in FIG. 11, a first register (m0r) 1103, a first selector (SEL1) 1110, a second register (m1r) 1104, a multiplier 1105, a third register (mr) 1106, an adder 1107, a fourth register (ar) 1108, and a second selector (SEL2) 1109 compose a filter algorism implementing unit 1100 which implements the first order FIR multiplication/accumulation operation. The filter algorism implementing unit 1100 performs the function of the filter algorism implementing unit 800 shown in FIG. 8.

In the filter algorithm implementing unit 1100, the first register (m0r) 1103 retains FIR coefficient data which the FIR coefficient memory 1101 outputs in synchronism with the clock of cycle subdividing the sampling period.

Further in the filter algorithm implementing unit 1100, the first selector (SEL1) 1110 selects either one of the input data 1111 in the sampling period and the delay-data output from the data memory 1102.

In the filter algorithm implementing unit 1100, the second register (m1r) 1104 retains data which the first selector (SEL1) 1110 outputs in synchronism with the clock.

In the filter algorithm implementing unit 1100, the multiplier 1105 multiplies FIR coefficient data output from the first register (m0r) 1103 and data output from the second register (m1r) 1104.

In the filter algorithm implementing unit 1100, the third register (mr) 1106 retains product data which the multiplier 1105 outputs in synchronism with the clock.

In the filter algorithm implementing unit 1100, the adder 1107 adds the product data output from the third register (mr) 1106 to the data output from the second selector (SEL2) 1109 together to be described in detail later.

In the filter algorithm implementing unit 1100, the fourth register (ar) 1108 retains the product data which the adder 1107 outputs in synchronism with the clock.

In the filter algorithm implementing unit 1100, the second selector (SEL2) 1109 selects either one of data of a value "0" and the product data output from the fourth register (ar) 1108 and feeds back the selected data as accumulated data to adder 1107.

In operation implemented by each of the FIR filter algorithm implementing units FIR(i)(1≤i≤X) having the hardware configuration shown in FIG. 11, during the continuous time duration within the sampling period assigned to the operation the filter algorithm implementing unit 1100 successively moves plural pieces of FIR coefficient data in the FIR coefficient memory 1101, which data correspond to the FIR filter algorithm implementing unit FIR(i), to the first register (m0r) 1103 in synchronism with the clock, and further successively moves the input data corresponding to each of the FIR filter algorithm implementing units FIR(i) or the delay-data output from the data memory 1102 from the first selector (SEL1) 1110 to the second register (m1r) 1104. Meanwhile, the filter algorithm implementing unit 1100 repeatedly implements the FIR multiplication/accumulation operation by the number of times corresponding to the filter order, and at the time when the FIR multiplication/accumulation operation has finished, the content registered in the fourth register (ar) 1108 is output as convolved data.

In the continuous time duration within the sampling period, which is assigned to each of the FIR filter algorithm implementing units FIR(i)(1≤i≤X) (Refer to FIG. 10), a time division processing is performed, and therefore one and more algorithms of the FIR filter algorithm implementing units FIR(i) can be calculated every sampling period and respective pieces of convolved data are output. In each of the FIR filter algorithm implementing units FIR(i), the filter coefficient data sets corresponding to the filter order are stored in the FIR coefficient memory 1101, whereby it can be applied flexibly to any filter order corresponding to a use.

Figure 12:
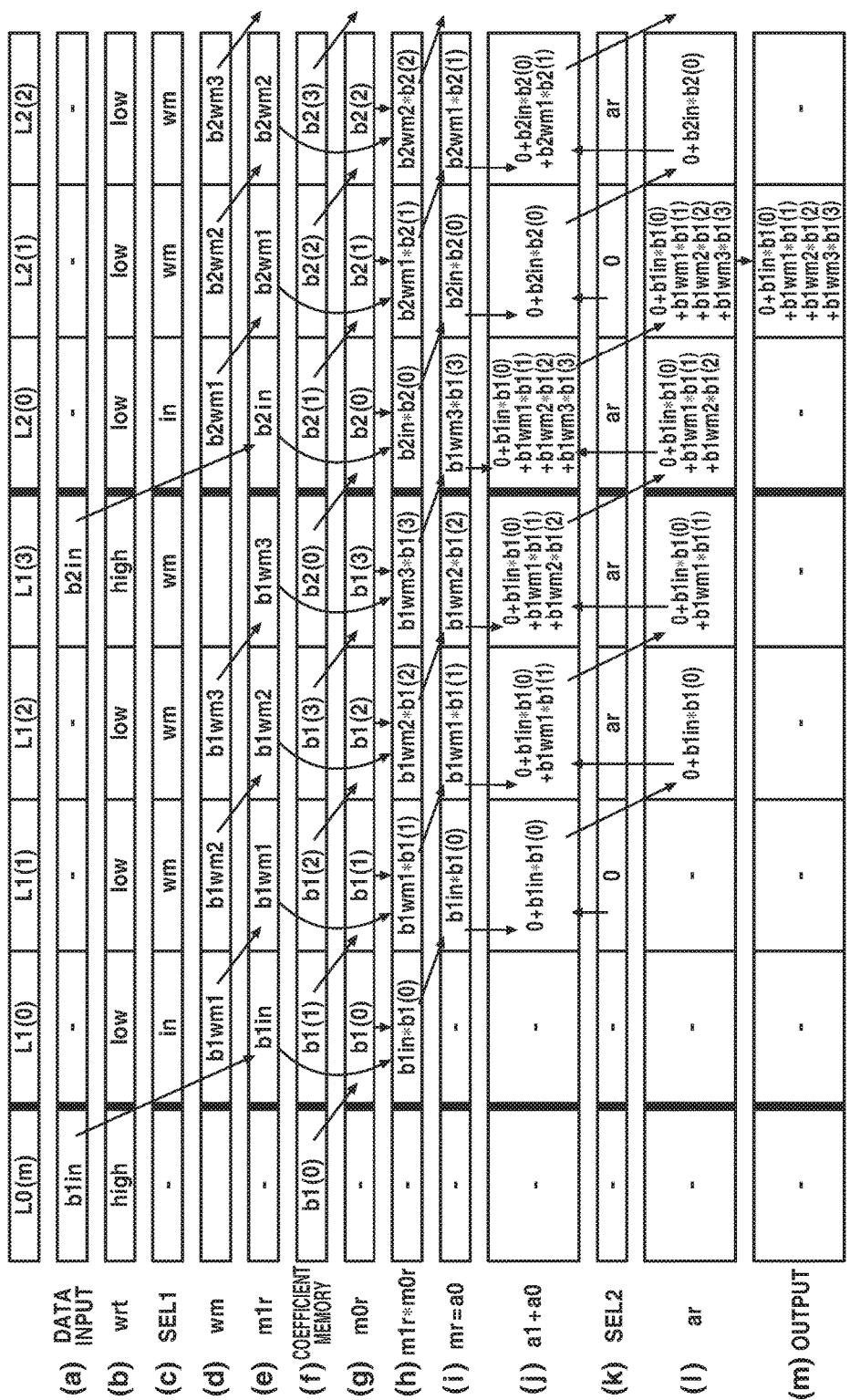
FIG. 12 is a timing chart indicating an example of the operation of the FIR filter algorithm implementing units FIR(i) which is performed by the FIR filter algorithm implementing unit having the hardware configuration shown in FIG. 11.

FIG. 12 is a timing chart indicating an example of the operation of the FIR filter algorithm implementing units FIR(i) which is performed by the FIR filter algorithm implementing unit having the hardware configuration shown in FIG. 11.

Figure 13:
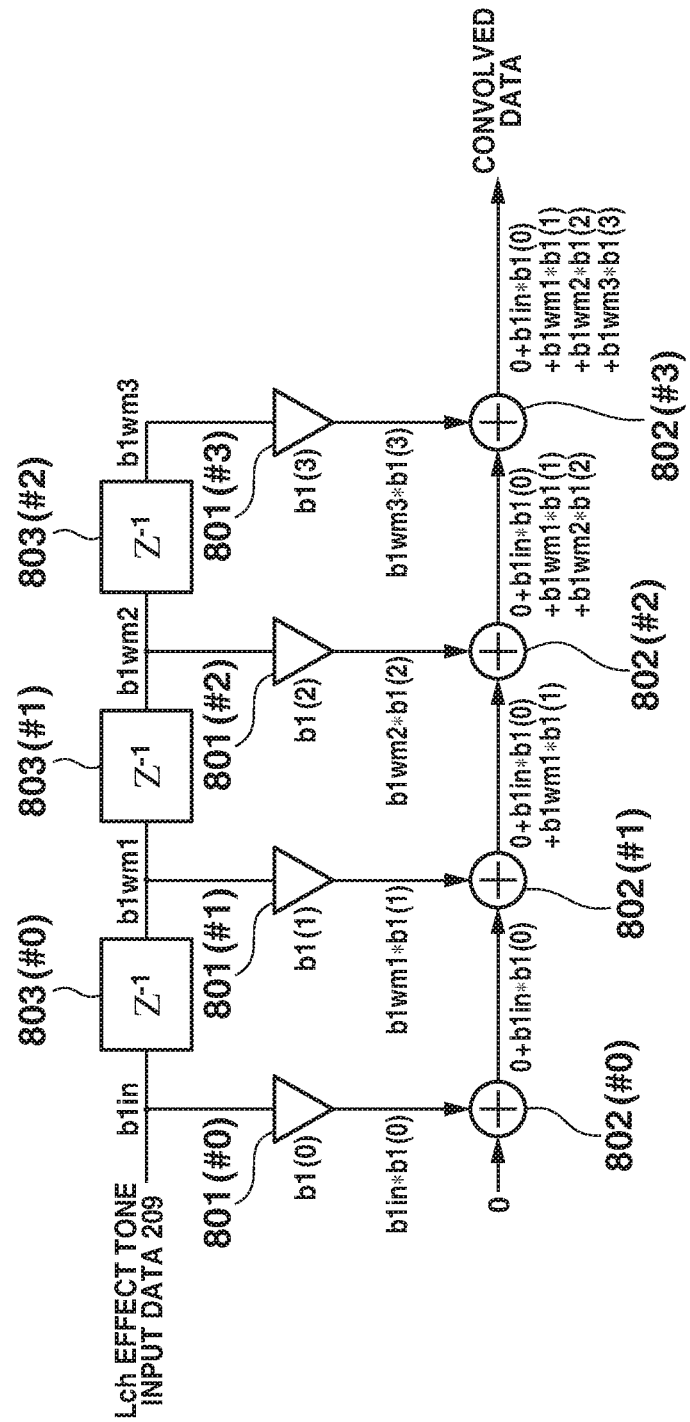
FIG. 13 is a view showing a relationship between the timing chart of FIG. 12 and the functions of the FIR filter algorithm implementing unit of FIG. 8.

FIG. 13 is a view showing a relationship between the timing chart of FIG. 12 and the functions of the FIR filter algorithm implementing unit of FIG. 8.

For simplicity of explanation, taking a case in which the block size is N=2 as an example, a process in which the FIR filter algorithm implementing units FIR(1) outputs the convolved data in the sampling period, and a part of a process which the following FIR filter algorithm implementing units FIR(2) will implement will be described. In the real FFT algorithm implementing unit, for example, N=128 and/or N=256 but the operation principle is the same.

In this case, the FIR(1) is the Lch FIR filter algorithm implementing unit 303 in the reverberation/resonance effect unit 211 (Lch) shown in FIG. 3 and the FIR(2) is the Rch FIR filter algorithm implementing unit 303 in the reverberation/resonance effect unit 211 (Rch) shown in FIG. 3.

In the FIR coefficient memory 1101 shown in FIG. 11, first 2N or four data sets [b1(0), b1(1), b1(2) and b1(3)] of impulse response data of the Lch reverberation/resonance tone are stored as an FIR coefficient data set "b1". These data sets are given by multiplication coefficients of the multiplication units 801(#0) to 801(#3) in the filter algorithm implementing units 800(#0) to 800(#3), as shown in FIG. 13. Similarly, in the FIR coefficient memory 1101, first 2N or four data sets [b2(0), b2(1), b2(2) and b2(3)] of impulse response data of the Rch reverberation/resonance tone are stored as an FIR coefficient data set "b2".

The input data 1111 corresponding to the FIR(1) is the Lch effect tone input data 209 shown in FIG. 2 or FIG. 3. It is assumed that a sampled value of the Lch effect tone input data 209 at the current sampling period is "b1in". Further, in the storing area in the data memory 1102 of FIG. 11 corresponding to the FIR(1), the Lch effect tone input data 209 from a sample value "b1wm(1)" in the last sampling period to a sampling value "b1wm(3)" in the sampling period before (2N−1)=3 sampling periods is stored as delay-data set "b1wm". In FIG. 13, the data "b1in" corresponds to the Lch effect tone input data 209, the data "b1wm1" corresponds to an output of the delay processing unit 803 (#0) which is equivalent to the data "b1in" delayed by one sampling period, the data "b1wm2" corresponds to an output of the delay processing unit 803(#1) which is equivalent to the data "b1wm1" delayed by one sampling period, and the data "b1wm3" corresponds to an output of the delay processing unit 803(#2) which is equivalent to the data "b1wm2" delayed by one sampling period.

Similarly, the input data 1111 corresponding to the FIR(2) is the Lch effect tone input data 210 shown in FIG. 2 or FIG. 3. It is assumed that a sampled value of the Rch effect tone input data 210 at the current sampling period is "b2in". Further, in the storing area in the data memory 1102 corresponding to the FIR(2), the Rch effect tone input data 210 from a sample value "b2wm(1)" in the last sampling period to a sampling value "b2wm(3)" in the sampling period before 3 sampling periods is stored as delay-data set "b2wm".

In FIG. 12, L0(m), L1(0), L1(1), L1(2), L1(3), L2(0), L2(1), L2(2), . . . indicate a timing of the clock having a cycle subdividing one sampling period. When it is assumed that the total of the maximum filter orders of the respective FIR filter algorithm implementing units FIR(1), FIR(2), . . . , FIR(X−1), and FIR(X) shown in FIG. 10 is "A", will be ideal that the "sampling period"=the "clock period X A". But practically the clock period will be decided in consideration of the performance of the effect applying unit 105 of FIG. 1, the sort and the filter order of the required FIR filter algorithm implementing unit, the capacities of the FIR coefficient memory 1101 and the data memory 1102, and the cost of the electronic musical instrument 100. Anyhow it is possible in the present embodiment to flexibly determine the sort and the filter order of the required FIR filter algorithm implementing unit.

In FIG. 12, the clock timings L0(*m*), L1(0), L1(1), L1(2), L1(3) are continuous time durations, assigned to the FIR filter algorithm implementing unit FIR(1) (Lch FIR filter algorithm implementing unit 303 in FIG. 3) to implement FIR filter algorithms by time division processing within one sampling period, and have a time duration of the clock number 4 corresponding to the filter order 2N=4 of the FIR(1). Similarly, the clock timings L2(0), L2(1), L2(2), L2(3) are continuous time durations, assigned to the FIR filter algorithm implementing unit FIR(2) (Rch FIR filter algorithm implementing unit 303 in FIG. 3) to implement FIR filter algorithms by time division processing within one sampling period, and have a time duration of the clock number 4 corresponding to the filter order 2N=4 of the FIR(2). L0(*m*) is the last clock timing in the continuous time durations, corresponding to the filter order "m" of the FIR filter algorithm implementing unit FIR(0) implementing the filter algorithm directly before the FIR(1).

At the clock timing L0(*m*) in FIG. 12, a value of the Lch effect tone input data 209 output from the mixer 205 of FIG. 2 will be a sample value "blin" in the current sampling period (FIG. 12, (a)) and a writing signal "wrt" on the data memory 1102 will be a high level (high), whereby the sample value "blin" will be written at an address indicated by an writing address pointer in the storing area corresponding to the FIR(1) in the data memory 1102. Meanwhile the first FIR coefficient data "b1(0)" in the FIR coefficient data set "b1" stored in the FIR coefficient memory 1101 is read from the address indicated by a reading address pointer (FIG. 12 (*f*)).

At the clock timing L1(0) in FIG. 12, the writing signal "wrt" to the data memory 1102 will be of a low level (low) (FIG. 12 (*b*)).

Meanwhile, when the first selector (SEL1) 1110 of FIG. 11 selects the input side "in" (FIG. 12 (*c*)), the sample value "blin" in the current sampling period, which is input at the clock timing L0(*m*), is latched to the second register (mlr) 1104 at the rising edge of the clock timing L1(0) and this sample value "blin" will be output from the second register (mlr) 1104 (FIG. 12 (*a*)→(*e*)).

Further, the first FIR coefficient data "b1(0)" which is output from the FIR coefficient memory 1101 at the clock timing L1(0) is latched to the first register (m0r) 1103 at the rising edge of the clock timing L1(0) and the data "b1(0)" will be output from the first register (m0r) 1103 (FIG. 12 (*f*)→(*g*)).

In the FIR coefficient memory 1101, when the reading address pointer is incremented at the rising edge of the clock timing L1(0), the second FIR coefficient data "b1(1)" in the FIR coefficient data set "b1" is output from the FIR coefficient memory 1101 (FIG. 12 (*f*)).

Further, in the data memory 1102, when the reading address pointer is incremented at the rising edge of the clock timing L1(0), the first delay-data "b1wm1" (in the last sampling period) in the delay-data set "b1wm" is output from the data memory 1102 (FIG. 12 (*d*)).

At the clock timing L1(0), the output "blin" of the second register (mlr) 1104 and the output "b1(0)" of the first register (m0r) 1103 are entered in the multiplier 1105, whereby product data "blin∗b1(0)" will be obtained (FIGS. 12 (*e*),(*g*)→(*h*)). (The symbol "∗" indicates multiplication.)

The above algorithm implemented at the clock timing L1(0) corresponds to the operation of the multiplication unit 801(#0) of FIG. 13.

At the clock timing L1(1) in FIG. 12, the writing signal "wrt" to the data memory 1102 will be of a low level (low) (FIG. 12 (*b*)). Meanwhile, when the first selector (SEL1) 1110 of FIG. 11 selects the memory side "wm" (FIG. 12 (*c*)), the delay-data "b1wm1" in the last sampling period, which was output from the data memory 1102 at the clock timing L1(0), is latched to the second register (mlr) 1104 at the rising edge of the clock timing L1(1) and this delay-data "b1wm1" will be output from the second register (mlr) 1104 (FIG. 12 (*d*)→(*e*)).

Further, the second FIR coefficient data "b1(1)", which was output from the FIR coefficient memory 1101 at the clock timing L1(0), is latched to the first register (m0r) 1103 at the rising edge of the clock timing L1(1) and the data "b1(1)" will be output from the first register (m0r) 1103 (FIG. 12 (*f*)→(*g*)).

In the FIR coefficient memory 1101, when the reading address pointer is incremented at the rising edge of the clock timing L1(1), the third FIR coefficient data "b1(2)" in the FIR coefficient data set "b1" is output from the FIR coefficient memory 1101 (FIG. 12 (*f*)).

Further, in the data memory 1102, when the reading address pointer is incremented at the rising edge of the clock timing L1(1), the second delay-data "b1wm2" (in the sampling period before the last sampling period) in the delay-data set "b1wm" is output from the data memory 1102 (FIG. 12 (*d*)).

At the rising edge of the clock timing L1(1), the product data "blin∗b1(0)", which was output from the multiplier 1105 at the clock timing L1(0), is latched to the third register (mr) 1106 and the product data appears at the output "a0" (FIG. 12 (*h*)→(*i*)).

At the clock timing L1(1), the output "b1wm1" of the second register (mlr) 1104 and the output "b1(1)" of the first register (m0r) 1103 are entered in the multiplier 1105, whereby product data "b1wm1∗b1(1)" will be obtained (FIGS. 12 (*e*),(*g*)→(*h*)). The above algorithm at the clock timing L1(1) corresponds to the operation of the multiplication unit 801(#1) of FIG. 13.

In addition, at the clock timing L1(1), the second selector (SEL2) 1109 selects data of a value "0" and the value of "0" appears at the output "a1" (FIG. 12 (*k*)).

At the clock timing L1(1) the output "a1" of the second selector (SEL2) 1109 and the output "a0" of the third register (mr) 1106 are entered in the adder 1107 and the sum of "0+blin∗b1(0)" will be obtained (FIGS. 12 (*k*),(*i*)→(*j*)). The above operation performed at the clock timing L1(1) corresponds to the operation of the accumulation unit 802 (#0) of FIG. 13.

At the clock timing L1(2) in FIG. 12, the writing signal "wrt" to the data memory 1102 will be of a low level (low) (FIG. 12 (*b*)).

Meanwhile, when the first selector (SEL1) 1110 of FIG. 11 selects the memory side "wm" (FIG. 12 (*c*)), the delay-data "b1wm2" in the sampling period before the last sampling period, which was output from the data memory 1102 at the clock timing L1(1), is latched to the second register (mlr) 1104 at the rising edge of the clock timing L1(2) and this delay-data "b1wm2" will be output from the second register (mlr) 1104 (FIG. 12 (*d*)→(*e*)).

Further, the third FIR coefficient data "b1(2)", which was output from the FIR coefficient memory 1101 at the clock timing L1(1), is latched to the first register (m0r) 1103 at the rising edge of the clock timing L1(2) and the data "b1(2)" will be output from the first register (m0r) 1103 (FIG. 12 (f)→(g)).

In the FIR coefficient memory 1101, when the reading address pointer is incremented at the rising edge of the clock timing L1(2), the fourth FIR coefficient data "b1(3)" in the FIR coefficient data set "b1" is output from the FIR coefficient memory 1101 (FIG. 12 (f)).

Further, in the data memory 1102, when the reading address pointer is incremented at the rising edge of the clock timing L1(2), the third delay-data "b1wm3" (in the sampling period before three sampling periods) in the delay-data set "b1wm" is output from the data memory 1102 (FIG. 12 (d)).

At the rising edge of the clock timing L1(2), the product data "b1wm1 ∗ b1(1)", which was output from the multiplier 1105 at the clock timing L1(1), is latched to the third register (mr) 1106 and the value of the product data appears at the output "a0" (FIG. 12 (h)→(i)).

At the clock timing L1(2), the output "blwm2" of the second register (mlr) 1104 and the output "b1(2)" of the first register (m0r) 1103 are entered in the multiplier 1105, whereby product data "blwm2 ∗ b1(2)" will be obtained (FIGS. 12 (e), (g)→(h)). The above operation performed at the clock timing L1(2) corresponds to the operation of the multiplication unit 801(#2) of FIG. 13.

In addition, at the rising edge of the clock timing L1(2) the sum data "0+blin ∗ b1(0)", which was output from the adder 1107 at the clock timing L1(1), is latched to the fourth register (ar) 1108 and the value of sum data appears at the output "ar" (FIG. 12 (j)→(l)).

At the clock timing L1(2), the second selector (SEL2) 1109 selects the output "ar" of the fourth register (ar) 1108, and the value appears at the output "a1" (FIG. 12 (k)).

As a result, at the clock timing L1(2) the output "a1" of the second selector (SEL2) 1109 and the output "a0" of the third register (mr) 1106 are entered in the adder 1107 and the sum of "0+b1in ∗ b1(0)+b1wm1 ∗ b1(1)" will be obtained (FIGS. 12 (l), (i)→(j)). The above calculation at the clock timing L1(2) corresponds to the operation of the accumulation unit 802(#1) of FIG. 13.

At the clock timing L1(3) in FIG. 12, when the first selector (SEL1) 1110 of FIG. 11 selects the memory side "wm" (FIG. 12 (c)), the delay-data "b1wm3" in the sampling period before three sampling periods, which was output from the data memory 1102 at the clock timing L1(2), is latched to the second register (mlr) 1104 at the rising edge of the clock timing L1(3) and this delay-data "b1wm3" will be output from the second register (mlr) 1104 (FIG. 12 (d)→(e)).

Further, the fourth FIR coefficient data "b1(3)", which was output from the FIR coefficient memory 1101 at the clock timing L1(2), is latched to the first register (m0r) 1103 at the rising edge of the clock timing L1(3) and the data "b1(3)" will be output from the first register (m0r) 1103 (FIG. 12 (f)→(g)).

At the rising edge of the clock timing L1(3), the product data "blwm2 ∗ b1(2)", which was output from the multiplier 1105 at the clock timing L1(2), is latched to the third register (mr) 1106 and the product data appears at the output "a0" (FIG. 12 (h)→(i)).

At the clock timing L1(3), the output "blwm3" of the second register (mlr) 1104 and the output "b1(3)" of the first register (m0r) 1103 are entered in the multiplier 1105, whereby product data "blwm3 ∗ b1(3)" will be obtained (FIG. 12 (e), (g)→(h)). The above operation performed at the clock timing L1(3) corresponds to the operation of the multiplication unit 801(#3) of FIG. 13.

In addition, at the rising edge of the clock timing L1(3) the sum data "0+blin ∗ b1(0)+blwm1 ∗ b1(1)", which was output from the adder 1107 at the clock timing L1(2), is latched to the fourth register (ar) 1108 and the value of sum data appears at the output "ar" (FIG. 12 (j)→(l)).

At the clock timing L1(3) the second selector (SEL2) 1109 selects the output "ar" of the fourth register (ar) 1108, and the value appears at the output "a1" (FIG. 12 (k)).

As a result, at the clock timing L1(3) the output "a1" of the second selector (SEL2) 1109 and the output "a0" of the third register (mr) 1106 are entered in the adder 1107 and the sum of "0+b1in ∗ b1(0)+b1wm1 ∗ b1(1)+blwm2 ∗ b1(2)" will be obtained (FIGS. 12 (l), (i)→(j)). The above algorithm performed at the clock timing L1(3) corresponds to the operation of the accumulation unit 802(#2) of FIG. 13.

Meanwhile, in the FIR coefficient memory 1101, when the reading address pointer is incremented at the rising edge of the clock timing L1(3), the first FIR coefficient data "b1(0)" in the FIR coefficient data set "b2" is output for the following FIR filter algorithm implementing unit FIR(2) (FIG. 12 (f)).

Further, at the clock timing L1(3), a value of Rch effect tone input data 210 output from the mixer 206 of FIG. 2 will be a sample value "b2in" of the current sampling period (FIG. 12 (a)), and the writing signal "wrt" to the data memory 1102 will be of a high level (high) (FIG. 12 (b)), whereby the sample value "b2in" will be written to the address in the data memory 1102, corresponding to FIR(2) and indicated by the writing address pointer.

At the clock timing L2(0) in FIG. 12 the writing signal "wrt" to the data memory 1102 will be of a low level (low) (FIG. 12 (b)).

Meanwhile, when the first selector (SEL1) 1110 of FIG. 11 selects the input side "in" (FIG. 12 (c)), the sample value "b2in" in the current sampling period, which was input at the clock timing L1(3), is latched to the second register (mlr) 1104 at the rising edge of the clock timing L2(0) and the value "b2in" will be output from the second register (mlr) 1104 (FIG. 12 (a)→(e)).

Further, the first FIR coefficient data "b2(0)", which was output from the FIR coefficient memory 1101 at the clock timing L1(3), is latched to the first register (m0r) 1103 at the rising edge of the clock timing L2(0) and the data "b2(0)" will be output from the first register (m0r) 1103 (FIG. 12 (f)→(g)).

In the FIR coefficient memory 1101, when the reading address pointer is incremented at the rising edge of the clock timing L2(0), the second FIR coefficient data "b2(1)" in the FIR coefficient data set "b2" is output from the FIR coefficient memory 1101 (FIG. 12 (f)).

Further, in the data memory 1102, when the reading address pointer is incremented at the rising edge of the clock timing L2(0), the first delay-data "b2wm1" (in the last sampling period) in the delay-data set "b2wm" is output from the data memory 1102 (FIG. 12 (d)).

At the rising edge of the clock timing L2(0), the product data "blwm3 ∗ b1(3)", which was output from the multiplier 1105 at the clock timing L1(3), is latched to the third register (mr) 1106 and the product data appears at the output "a0" (FIG. 12 (h)→(i)).

At the clock timing L2(0), the output "b2in" of the second register (mlr) 1104 and the output "b2(0)" of the first register (m0r) 1103 are entered in the multiplier 1105, whereby product data "b2in∗ b2(0)" will be obtained (FIGS. 12 (e), (g)→(h)). At this time the operation of the FIR(1) and the operation of the FIR(2) start simultaneously.

In addition, at the rising edge of the clock timing L2(0) the sum data "0+blin∗ b1(0)+blwm1∗ b1(1)+blwm2∗ b1(2)", which was output from the adder 1107 at the clock timing L1(3), is latched to the fourth register (ar) 1108 and the value of sum data appears at the output "ar" (FIG. 12 (j)→(l)).

At the clock timing L2(0) the second selector (SEL2) 1109 selects the output "ar" of the fourth register (ar) 1108, and the value appears at the output "a1" (FIG. 12 (k)).

As a result, at the clock timing L2(0) the output "a1" of the second selector (SEL2) 1109 and the output "a0" of the third register (mr) 1106 are entered in the adder 1107 and the sum data of "0+b1in∗ b1(0)+b1wm1∗ b1(1)+b1wm2∗ b1(2)+b1wm3∗ b1(3)" will be obtained (FIGS. 12 (l), (i)→(j)). The above operation performed at the clock timing L2(0) corresponds to the operation of the accumulation unit 802 (#3) of FIG. 13.

At the clock timing L2(1) in FIG. 12 the writing signal "wrt" to the data memory 1102 will be of a low level (low) (FIG. 12 (b)).

Meanwhile, when the first selector (SEL1) 1110 of FIG. 11 selects the memory side "wm" (FIG. 12 (c)), the delay-data "b2wm1" in the last sampling period, which was output from the data memory 1102 at the clock timing L2(0), is latched to the second register (mlr) 1104 at the rising edge of the clock timing L2(1) and the data "b2wm1" will be output from the second register (mlr) 1104 (FIG. 12 (d)→(e)).

Further, the second FIR coefficient data "b2(1)", which was output from the FIR coefficient memory 1101 at the clock timing L2(0), is latched to the first register (m0r) 1103 at the rising edge of the clock timing L2(1) and the data "b2(1)" will be output from the first register (m0r) 1103 (FIG. 12 (f)→(g)).

In the FIR coefficient memory 1101, when the reading address pointer is incremented at the rising edge of the clock timing L2(1), the third FIR coefficient data "b2(2)" in the FIR coefficient data set "b2" is output from the FIR coefficient memory 1101 (FIG. 12 (f)).

Further, in the data memory 1102, when the reading address pointer is incremented at the rising edge of the clock timing L2(1), the second delay-data "b2wm2" (in the sampling period before the last sampling period) in the delay-data set "b2wm" is output from the data memory 1102 (FIG. 12 (d)).

At the rising edge of the clock timing L2(1), the product data "b2in∗ b2(0)", which was output from the multiplier 1105 at the clock timing L2(0), is latched to the third register (mr) 1106 and the product data appears at the output "a0" (FIG. 12 (h)→(i)).

At the clock timing L2(1), the output "b2wm1" of the second register (mlr) 1104 and the output "b2(1)" of the first register (m0r) 1103 are entered in the multiplier 1105, whereby product data "b2wm1∗ b2(1)" will be obtained (FIGS. 12 (e), (g)→(h)).

In addition, at the clock timing L2(1) the second selector (SEL2) 1109 selects the data of a value "0" and the value appears at the output "a1" (FIG. 12 (k)).

At the clock timing L2(1) the output "a1" of the second selector (SEL2) 1109 and the output "a0" of the third register (mr) 1106 are entered in the adder 1107 and the sum data of "0+b2in∗ b2(0)" will be obtained (FIGS. 12 (k), (i)→(j)).

Further, at the rising edge of the clock timing L2(1) the sum data "0+blin∗ b1(0)+b1wm1∗ b1(1)+b1wm2 ∗ b1(2)+b1wm3∗ b1(3)", which was output from the adder 1107 at the clock timing L2(0), is latched to the fourth register (ar) 1108 and the value of sum data appears at the output "ar" (FIG. 12 (j)→(l)).

The output data of "0+blin∗ b1(0)+b1wm1∗ b1(1)+blwm2∗ b1(2)+b1wm3∗ b1(3)" appears at the fourth register "ar" 1108 at the clock timing L2(1) after two clocks from the last clock timing L1(3) in the continuous time duration corresponding to the FIR(1). This output data is output as data convolved in the FIR(1) (Lch effect tone output data 211 in FIG. 3) from the adding unit 305 of FIG. 3. The output data corresponds to the convolved data output from the accumulation unit 802(#3) in FIG. 13.

At the clock timing L2(2) in FIG. 12 the writing signal "wrt" to the data memory 1102 will be of a low level (low) (FIG. 12 (b)).

Meanwhile, when the first selector (SEL1) 1110 of FIG. 11 selects the memory side "wm" (FIG. 12 (c)), the delay-data "b2wm2" in the sampling period before the last sampling period, which was output from the data memory 1102 at the clock timing L2(1), is latched to the second register (mlr) 1104 at the rising edge of the clock timing L2(2) and the data "b2wm2" will be output from the second register (mlr) 1104 (FIG. 12 (d)→(e)).

Further, the third FIR coefficient data "b2(2)", which was output from the FIR coefficient memory 1101 at the clock timing L2(1), is latched to the first register (m0r) 1103 at the rising edge of the clock timing L2(2) and the data "b2(2)" will be output from the first register (m0r) 1103 (FIG. 12 (f)→(g)).

In the FIR coefficient memory 1101, when the reading address pointer is incremented at the rising edge of the clock timing L2(2), the fourth FIR coefficient data "b2(3)" in the FIR coefficient data set "b2" is output from the FIR coefficient memory 1101 (FIG. 12 (f)).

Further, in the data memory 1102, when the reading address pointer is incremented at the rising edge of the clock timing L2(2), the third delay-data "b2wm3" (in the sampling period before three sampling periods) in the delay-data set "b2wm" is output from the data memory 1102 (FIG. 12 (d)).

At the rising edge of the clock timing L2(2), the product data "b2wm1∗ b2(1)", which was output from the multiplier 1105 at the clock timing L2(1), is latched to the third register (mr) 1106 and the product data appears at the output "a0" (FIG. 12 (h)→(i)).

At the clock timing L2(2), the output "b2wm2" of the second register (mlr) 1104 and the output "b2(2)" of the first register (m0r) 1103 are entered in the multiplier 1105, whereby product data "b2wm2∗ b2(2)" will be obtained (FIGS. 12 (e), (g)→(h)).

In addition, at the rising edge of the clock timing L2(2) the sum data "0+b2in∗ b2(0)", which was output from the adder 1107 at the clock timing L2(1), is latched to the fourth register (ar) 1108 and the value of sum data appears at the output "ar" (FIG. 12 (j)→(l)).

At the clock timing L2(2) the second selector (SEL2) 1109 selects the output "ar" of the fourth register (ar) 1108 and the value of output "ar" appears at the output "a1" (FIG. 12 (k)).

As a result, at the clock timing L2(2) the output "a1" of the second selector (SEL2) 1109 and the output "a0" of the third register (mr) 1106 are entered in the adder 1107 and the sum data of "0+b2in∗b2(0)+b2wm1∗b2(1)" will be obtained (FIGS. 12 (*l*), (*i*)→(*j*)).

As described above, it is possible without causing inconsistency in data to implement the arithmetic processing and outputting operation of the FIR filter algorithm implementing unit FIR(1) and further the arithmetic processing and outputting operation of the FIR filter algorithm implementing unit FIR(2) by means of the time division process performed in synchronism with the clock having a cycle subdividing the sampling period, and plural FIR filter algorithms of the filter orders set separately can be implemented without delay every sampling period. Therefore, for instance, in a case where impulse response data is short, FIR resource with block size reduced can be used in another filter processing. Meanwhile, in a case where the impulse response data is long, since the coefficient data size for convolution used by the CONV algorithm implementing unit 304 of FIG. 3 will be large, when the RAM 306 (FIG. 3) installed on DSP or the effect applying unit 105 of FIG. 2 is shared between the CONV algorithm implementing unit 304 and the FIR filter algorithm implementing unit, and the block size "N" in the CONV algorithm implementing unit 304 is fixed, it will be hard to adjust the block size so as to meet the memory area. But the configuration of the present embodiment will allow to adjust the block size and the operation performed in the adding unit 105 can be optimized.

In the present embodiment of the invention, the filter orders 2N (real coefficient data) for the FIR filter algorithm implementing unit 303 of FIG. 3 and the resultant data obtained by performing FFT algorithm on every block of the real coefficient data following the above 2N for the CONV algorithm implementing unit 304 of FIG. 3 are stored in the RAM 306 of FIG. 3. But when the block size "N" is variable, the memory size for storing the above data will increase. When the impulse response data is stored as the coefficient data in the RAM 306 of FIG. 3 and the block size "N" is decided based on the reverberation time and system conditions of the apparatus, the first 2N of impulse response data stored in the RAM 306 is supplied to the FIR filter algorithm implementing unit 303, and the data following the 2N which is transformed by the FFT algorithm is expanded on the RAM 306 and supplied to the CONV algorithm implementing unit 304. If it will finish to expand the data over the RAM 303 while the FIR filter algorithm implementing unit 303 is processing the N samples of input data, there will be no influence given on the operation of the CONV algorithm implementing unit 304.

Supposing that an optimal condition have been set previously, each block size is decided and information of the decided block sizes and FFT transform data for the CONV algorithm implementing unit 304 are stored in the RAM 306, and when the block size "N" is decided for implementing convolution and the decided block size "N" is compared with the information of the decided block sizes stored in the RAM 306. It will be practical to implement the FFT algorithm, only when the decided block size "N" is not equivalent to the information of the decided block sizes.

Figure 14:
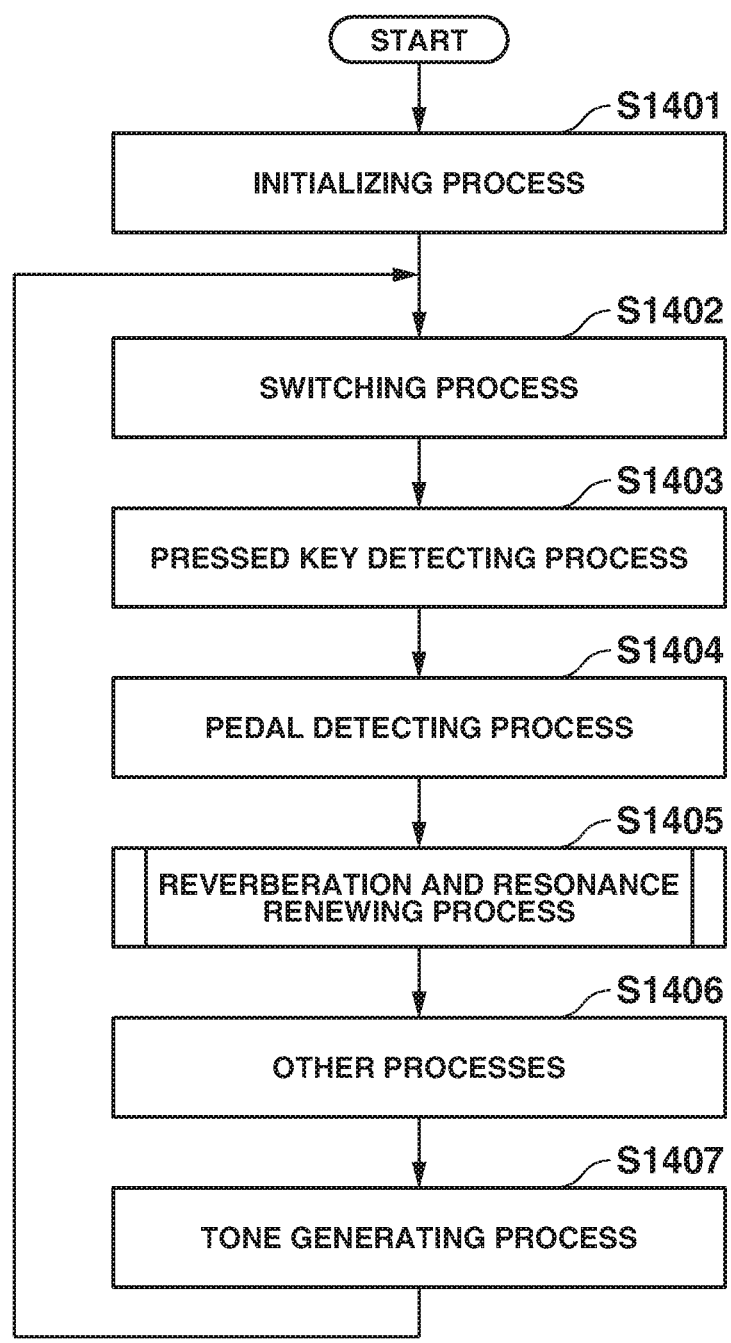
FIG. 14 is a flow chart showing an example of the whole controlling operation executed by the CPU 101 (FIG. 1) to realize a reverberation/resonance effect unit (FIG. 2) with a block size variable actively.

FIG. 14 is a flow chart showing an example of the whole controlling operation executed by the CPU 101 (FIG. 1) to realize the reverberation/resonance effect unit 211 (FIG. 2) with a block size variable actively. The CPU 101 reads a control program stored in the ROM 102 to load the same onto the RAM 103, thereby executing the whole operation.

In the electronic musical instrument 100 shown in FIG. 1, when a power switch of the operator 108 is turned on, the CPU 101 starts its controlling operation in accordance with the flow chart shown in FIG. 14. At first the CPU 101 initializes the RAM 103, the tone generator (TG) 104, the effect adding apparatus (step S1401). Thereafter, the CPU 101 repeatedly executes a series of processes from step S1402 to step S1407 until the power switch is turned off.

The CPU 101 executes a switching process (step S1402), where the CPU 101 watches the operated condition of the operator 108 shown in FIG. 1.

The CPU 101 executes a pressed key detecting process (step S1403), where the CPU 101 detects pressed key(s) of the keyboard 106 shown in FIG. 1.

The CPU 101 executes a pedal detecting process (step S1404), where the CPU 101 judges the operated condition of the pedal 107 shown in FIG. 1.

The CPU 101 executes a reverberation and resonance renewing process (step S1405). In the reverberation and resonance renewing process, the CPU 101 confirms a judging result in the switching process (step S1402) and a detected result in the pedal detecting process (step S1404) to control the effect applying unit 105, thereby making the reverberation/resonance effect unit 211(Lch) and the reverberation/resonance effect unit 211(Rch) apply reverberation/resonance effects respectively to the Lch effect tone input data 209 and the Rch effect tone input data 210 generated by the tone generator (TG) 104.

The CPU 101 executes other processes (step S1406) such as a controlling process for adjusting musical tone envelops.

The CPU 101 executes a tone generating process (step S1407), where the CPU 101 gives the tone generator (TG) an instruction to generate a tone based on the pressed key or released key detected in the pressed key detecting process (step S1403).

Figure 15:
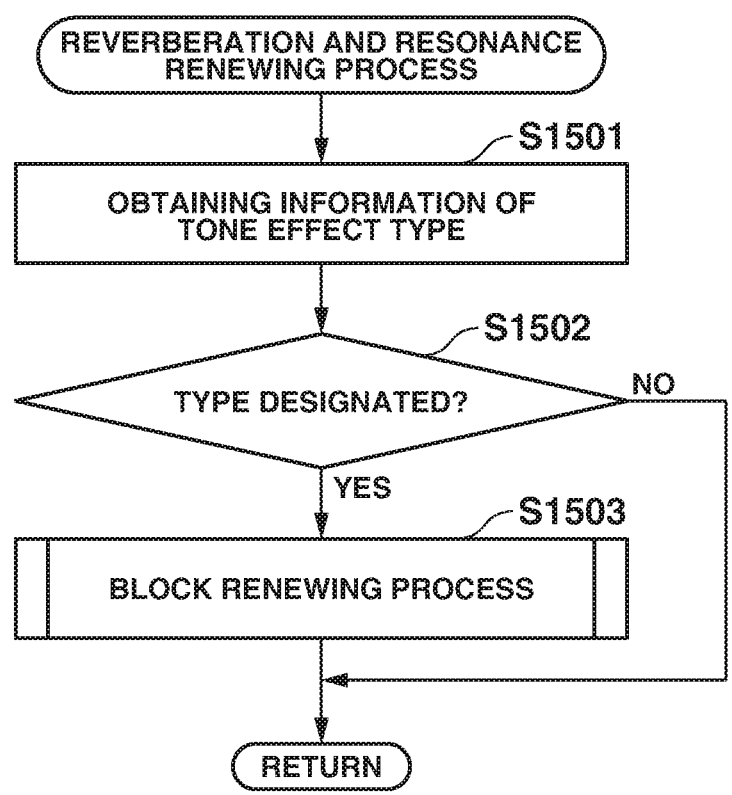
FIG. 15 is a flow chart showing a detailed example of a reverberation and resonance renewing process (step S1405).

FIG. 15 is a flow chart showing a detailed example of the reverberation and resonance renewing process (step S1405).

The CPU 101 confirms the judging result in the switching process (step S1402) to refer data stored in the ROM 102 of FIG. 1, thereby obtaining information concerning a type of tone effect (step S1501).

Further, the CPU 101 judges whether a type of tone effect has been designated by the operator 108 (step S1502).

When it is decided YES at step S1502, the CPU 101 executes the reverberation and resonance renewing process on a block size "BL" (=N) in the operation of the reverberation/resonance effect unit 211 (Lch, Rch) (FIG. 3) (step S1503) and then returns to step S1406 in FIG. 14. When it is decided NO at step S1502, the CPU 101 returns directly to step S1406 in FIG. 14. Then CPU 101 finishes the reverberation and resonance renewing process and returns to the flow chart of FIG. 14.

Figure 16:
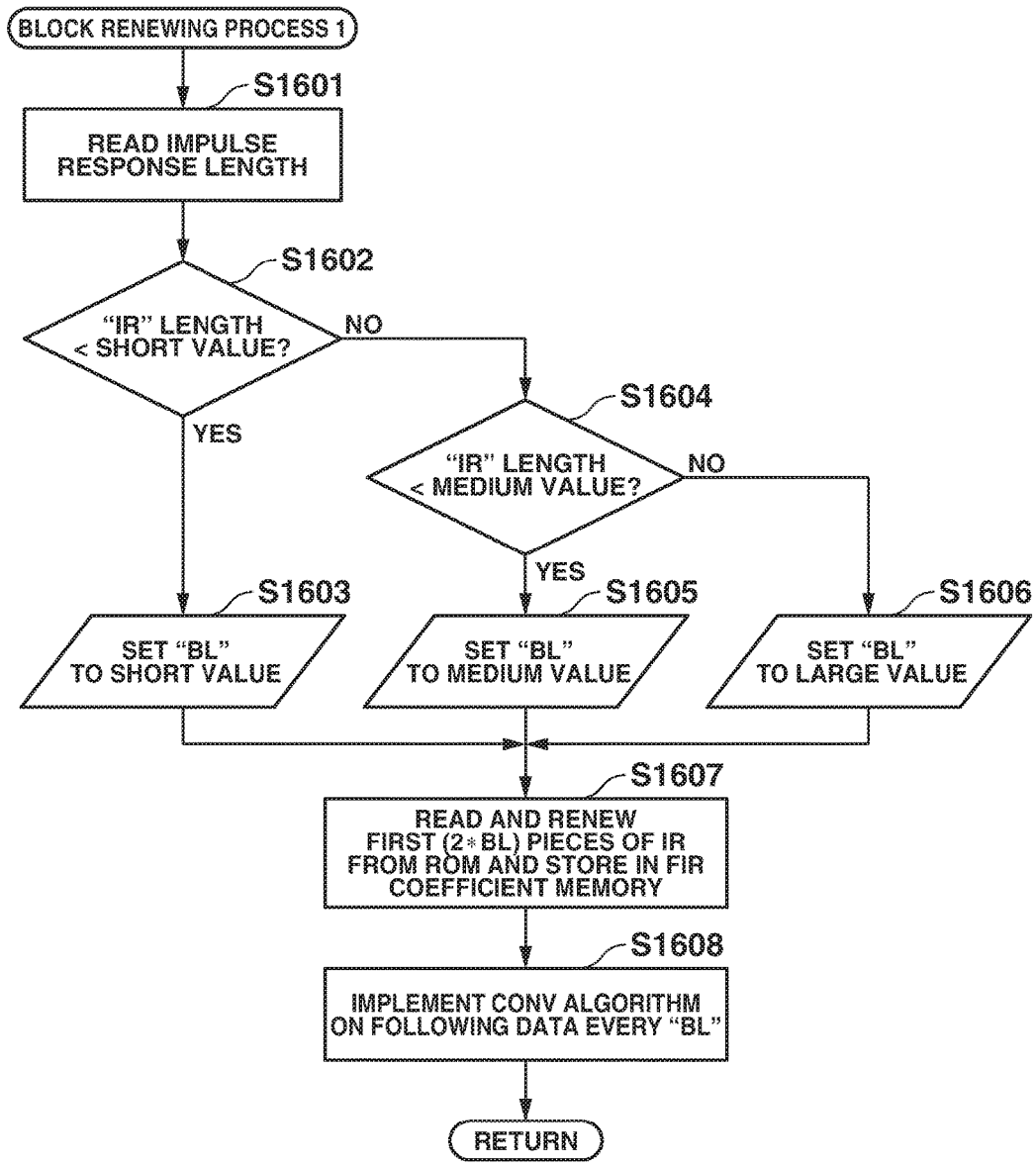
FIG. 16 is a flowchart showing a detailed example (No. 1) of a block renewing process (step S1503 in FIG. 15).

FIG. 16 is a flow chart showing a detailed example (No. 1) of a block renewing process (step S1503 in FIG. 15).

The CPU 101 refers to a convolution table stored in the ROM 102 to read an impulse response length (IR: Impulse Response) of impulse response data (step S1601). The information concerning a type of tone effect obtained at step S1501 in FIG. 15 is stored with a convolution table number in the convolution table of the ROM 102.

The CPU 101 judges whether the impulse response length (IR length) is shorter than a short threshold value (step S1602).

When it is determined YES at step S1602, the CPU 101 sets the block size "BL" to a prescribed short value (step S1603).

When it is determined NO at step S1602, the CPU 101 judges whether the impulse response length (IR length) is shorter than a medium threshold value (step S1604).

When it is determined YES at step S1604, the CPU 101 sets the block size "BL" to a prescribed medium value (step S1605).

When it is determined NO at step S1604, the CPU 101 sets the block size "BL" to a prescribed large value (step S1606).

After implementing the processes at step S1603, S1605, or S1606, the CPU 101 reads first 2*BL pieces of impulse response data stored in the ROM 102 (or the data loaded on the RAM 306 (FIG. 3) in DSP of the effect adding apparatus 100 from the ROM 102) and stores and renews the same on the FIR coefficient memory 1101 (FIG. 11) composing the FIR filter algorithm implementing unit 303 (step S1607).

Further, the CPU 101 implements the FFT algorithm on the data following the 2*BL pieces of impulse response data every blocks BL and expands the transformed data on the RAM 306 (FIG. 3) to supply the same to the CONV algorithm implementing unit 304 (step S1608). And then the CPU 101 finishes the block renewing process of FIG. 16, and returns to the flow chart of FIG. 15.

Figure 17:
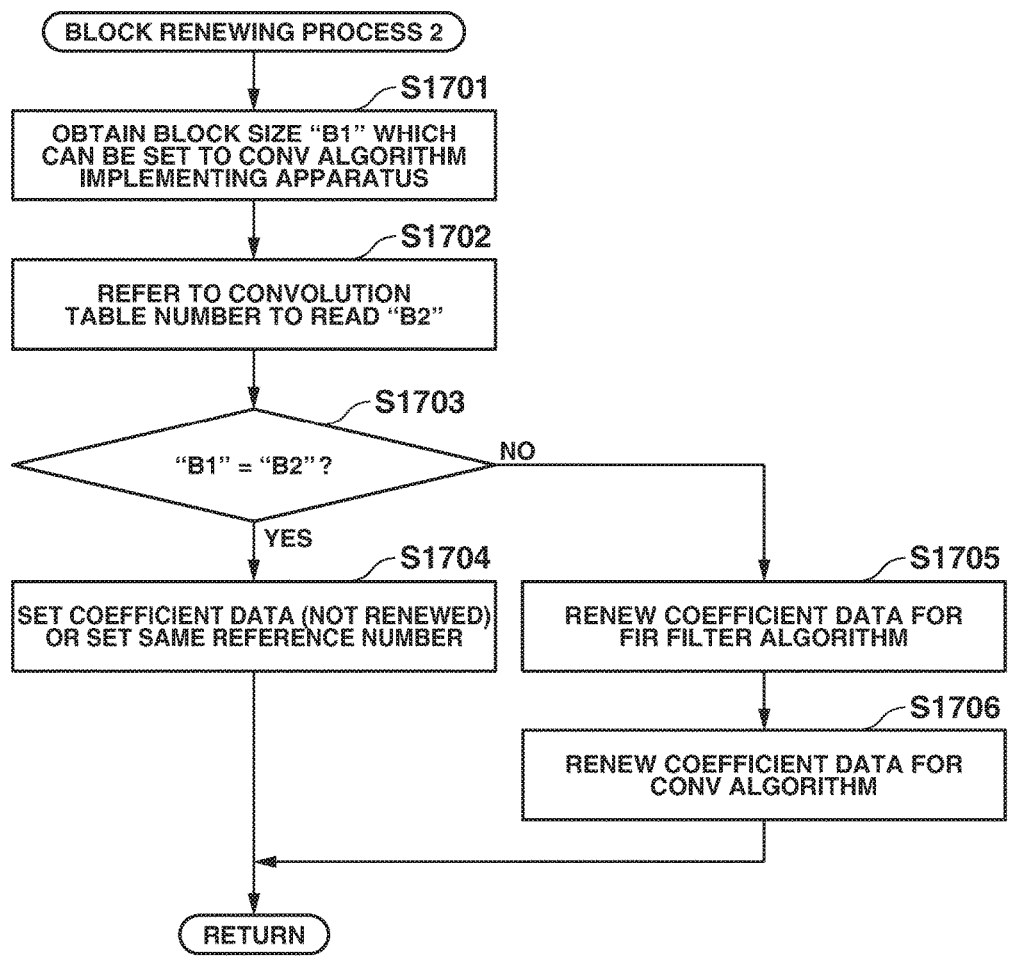
FIG. 17 is a flow chart showing another detailed example (No. 2) of the block renewing process (step S1503 in FIG. 15).

FIG. 17 is a flow chart showing another detailed example (No. 2) of the block renewing process (step S1503 in FIG. 15).

The CPU 101 confirms the system condition or, for example, refers to the table in the ROM 102 to obtain a block size "B1" which can be set to the CONV algorithm implementing unit 304 of FIG. 3 (step S1701).

The CPU 101 refers to the convolution table stored in the ROM 102 to read a block size "B2" (step S1702). The information concerning a type of tone effect obtained at step S1501 in FIG. 15 is stored together with a convolution table number in the convolution table of the ROM 102.

The CPU 101 judges whether the block size "B1" obtained based on the system condition at step S1701 is equivalent to the block size "B2" obtained based on the type of tone effect (step S1703).

When it is determined YES at step S1703, the coefficient data for the FIR filter algorithm implementing unit 303 and the CONV algorithm implementing unit 304 is not renewed, and the same coefficient data is set or only the same reference number is set (step S1704).

When it is determined NO at step S1703, the coefficient data for the FIR filter algorithm implementing unit 303 and the CONV algorithm implementing unit 304 are renewed in a similar manner to the manner at steps S1607 and S1608 (step S1705).

After implementing the process at step S1704 or S1706, the CPU 101 finishes the block renewing process shown in FIG. 16, and returns to the flow chart of FIG. 15.

As described above, the embodiments of the present invention realize the signal processing apparatus which can change the filter order flexibly and also implement plural sorts of FIR filter algorithms.

In the embodiments of the present invention, when the FIR filter algorithm and CONV algorithm are implemented in combination to implement convolution, impulse response can be applied to a musical tone signal without block delay, while the block size is changed flexibly in accordance with the tone generating setting condition and the system condition. Therefore, the combination of FIR filter algorithm and CONV algorithm according to the embodiments of the invention can be used in the electronic musical instruments, enhancing response and reproducibility in their performance.

In the above embodiments, the controlling unit for performing various controlling operations is composed of CPU (general purpose processor) which executes a program stored in ROM (memory). But it is possible to compose such controlling unit with plural processors each specified in for performing a specific controlling operation. Each specified processor can be composed of a general processor (electronic circuit) for executing an arbitrary program and a memory for storing a control program for a specific control or specific electronic circuits each specified in a specific control.

Various sorts of filters (filtering operation implementing units) in the above embodiments can be composed of an analog circuit(s) or DSP (digital signal processor).

The apparatus for providing the various sorts of effects as described above can be composed of the above structures but also can be composed as follows:

Configuration Example of the Apparatus: No. 1

The apparatus is provided with a first memory in which plural pieces of coefficient data used for implementing a filter algorithm are stored; and a processor which receives plural pieces of input data to be subjected to the filter algorithm, implements the filter algorithm using the plural pieces of coefficient data stored in the first memory and the plural pieces of received input data as many times as the number corresponding to a designated filter order, and outputs a result of implementing the filter algorithm, in which filter algorithm each piece of coefficient data and each piece of input data are multiplied together and resultant products are summed up.

Configuration Example of the Apparatus: No. 2

The apparatus recited in the configuration example No. 1 is further provided with a second memory which stores plural pieces of received input data, wherein the filter algorithm is a Finite Impulse Response (FIR) filter algorithm; the first memory stores plural pieces of FIR coefficient data; and the processor implements the FIR filter algorithm using the plural pieces of FIR coefficient data stored in the first memory and the plural pieces of received input data stored in the second memory as many times as the number corresponding to a designated filter order, in which filter algorithm each piece of FIR coefficient data and each piece of input data are multiplied together and resultant products are summed up.

Configuration Example of the Apparatus: No. 3

The apparatus recited in the Configuration examples No. 1 and No. 2, wherein the processor can designate a number corresponding to the filter order of the filter algorithm to be implemented within a predetermined number; the first memory stores at least the predetermined number of pieces of coefficient data; the second memory stores at least the predetermined number of pieces of input data.

Configuration Example of the Apparatus: No. 4

The apparatus recited in the configuration examples No. 1 to No. 3 is further provided with a filter algorithm implementing unit which implements a first-order filter algorithm, wherein the first memory stores plural coefficient data sets as many as the number corresponding to the filter order of the filter algorithm at least for one sort of filter algorithm of variable filter order; the second memory stores input data set from the last sample to the sample before the (filter order−1)-th sample for the filter algorithm as delay data set; and the processor successively supplies the coefficient data stored in the first memory and current input data or the delay data stored in the second memory to the filter algorithm implementing unit and makes the filter algorithm implementing unit repeatedly implement the first-order filter algorithm by time division processing of a dividing time length corresponding to the filter order and output output-data in each sampling period.

Configuration Example of the Apparatus: No. 5

The apparatus recited in the configuration example No. 4, wherein the processor assigns continuous time durations of a time length counted by a clock having a cycle subdividing a sampling period to the filter algorithms respectively, each time length being long enough for implementing the filter algorithm of the filter order in the sampling period; successively supplies the coefficient data stored in the first memory and the current input data or the delay data stored in the second memory to the filter algorithm implementing unit and makes the filter algorithm implementing unit implement the filter algorithm in the continuous time duration, in which filter algorithm the successively supplied data are multiplied together and resultant products are summed up in synchronism with the clock; and controls the filter algorithm implementing unit to output output-data of the filter algorithms in each sampling period.

Configuration Example of the Apparatus: No. 6

The apparatus recited in the configuration example No. 4, wherein the filter algorithm implementing unit has: a first register which retains in synchronism with the clock the coefficient data output from the first memory; a first selector which selects either one of input data in the current sampling period and the delay data output from the second memory; a second register which holds in synchronism with the clock the data output from the first selector; a multiplier which multiplies the coefficient data output from the first register and the data output from the second register to obtain product data; a third register which retains in synchronism with the clock the product data output from the multiplier; an adder which adds the product data output from the third register and current summed-up data together to obtain sum data; a fourth register which retains in synchronism with the clock the sum data output from the adder; and a second selector which selects either one of data of a value "0" and the sum data output from the fourth register to feed back the selected data as the summed-up data to the adder.

Configuration Example of the Apparatus: No. 7

The apparatus for applying an acoustic effect to an original tone by convoluting the original tone with impulse response data of an acoustic effect tone, the apparatus having: a time-domain convolution implementing unit which employs the FIR filter algorithm implemented by the signal processing apparatus recited in the configuration example No. 2 to convolute the original tone with first half data of the impulse response data in a time domain of unit of the sampling period; and a frequency-domain convolution implementing unit which implement a Fast Fourier Transform algorithm on second half data of the impulse response data in a frequency domain of unit of block, thereby convoluting the original tone with the second half data.

Configuration Example of the Apparatus: No. 8

The apparatus recited in the configuration example No. 7, wherein the first half data and the second half data of the impulse response data are set arbitrarily.

Configuration Example of the Apparatus: No. 9

The apparatus recited in the configuration example No. 7 is further provided with a setting unit which decides a block size of the block and sets a filter order of the FIR filter algorithm and an FFT point number of FFT algorithm implementing unit to twice as large as the block size.

Configuration Example of the Apparatus: No. 10

The apparatus recited in the configuration example No. 9, wherein the setting unit decides the block size in accordance with a time length of the impulse response data.

Configuration Example of the Apparatus: No. 11

The apparatus recited in the configuration example No. 9, wherein the setting unit decides the block size in accordance with a tone generation setting condition of the original tone.

Configuration Example of the Apparatus: No. 12

The apparatus recited in the configuration example No. 9, wherein the setting unit stores coefficient data in a time domain of the impulse response data; after deciding the block size, removes FIR coefficient data of filter order equivalent to twice as large as the block size to be used in the FIR filter algorithm from the coefficient data of the impulse response data to obtain remaining coefficient data; and implements a Fast Fourier Transform algorithm on the remaining coefficient data to transform the same data to coefficient data for convolution in the frequency domain, expanding the same on a memory.

Configuration Example No. 13 of the Apparatus

The apparatus recited in the Configuration example 12, wherein the setting unit adds data indicating the decided block size to the coefficient data for convolution in the frequency domain and stores resultant data; when the block size is decided again and the decided block size is different from the previously stored block size, implements the Fast Fourier Transform algorithm on the coefficient data for convolution in the frequency domain, thereby renewing the same coefficient data.

Although specific embodiments of the invention have been described in the foregoing detailed description, it will be understood that the invention is not limited to the particular embodiments described herein, but modifications and rearrangements may be made to the disclosed embodiments while remaining within the scope of the invention as defined by the following claims. It is intended to include all such modifications and rearrangements in the following claims and their equivalents.

What is claimed is:
1. A signal processing apparatus comprising:
a first memory which stores plural pieces of coefficient data used for implementing a filter algorithm and containing plural coefficient data sets as many as a number corresponding to a filter order of the filter algorithm for at least one sort of filter algorithm of a variable filter order;

a second memory which stores input data sets from a last sample to a sample before the (filter order-1)-th sample for every filter algorithm as delay data sets; and a processor which receives plural pieces of input data to be subjected to the filter algorithm, executes the filter algorithm using the plural pieces of coefficient data stored in the first memory and the plural pieces of received input data as many times as a number corresponding to a designated filter order, and outputs an execution result of the filter algorithm, in which filter algorithm each piece of coefficient data and each piece of input data are multiplied together and resultant products are summed up, and further, successively receives the coefficient data stored in the first memory and current input data stored in the second memory, repeatedly implements a first-order filter algorithm by time division processing of a dividing time length corresponding to the filter order, and outputs output-data within each sampling period.

2. The signal processing apparatus according to claim 1, wherein:

the second memory stores the plural pieces of received input data;

the filter algorithm is a Finite Impulse Response (FIR) filter algorithm;

the first memory stores plural pieces of FIR coefficient data; and the processor implements the FIR filter algorithm using the plural pieces of FIR coefficient data stored in the first memory and the plural pieces of received input data stored in the second memory as many times as the number corresponding to a designated filter order, in which filter algorithm each piece of FIR coefficient data and each piece of input data are multiplied together and resultant products are summed up.

3. The signal processing apparatus according to claim 1, wherein:

the processor is configured to designate a number corresponding to the filter order of the filter algorithm to be implemented within a predetermined number;

the first memory stores at least the predetermined number of pieces of coefficient data; and the second memory stores at least the predetermined number of pieces of input data.

4. The signal processing apparatus according to claim 1, wherein the processor:

assigns continuous time durations of a time length counted by a clock having a cycle subdividing a sampling period to the filter algorithms respectively, each time length being long enough for implementing the filter algorithm of the filter order in the sampling period, successively supplies the coefficient data stored in the first memory and the current input data or the delay data stored in the second memory to the filter algorithm implementing unit, and makes the filter algorithm implementing unit implement the filter algorithm in the continuous time duration, in which filter algorithm the successively supplied data are multiplied together and resultant products are summed up in synchronism with the clock, and controls the filter algorithm implementing unit to output output-data of the filter algorithms in each sampling period.

5. The signal processing apparatus according to claim 1, further comprising a filter algorithm implementing unit, the filter algorithm implementing unit comprising:

a first register which retains in synchronism with the clock the coefficient data output from the first memory;

a first selector which selects either one of input data in the current sampling period and the delay data output from the second memory;

a second register which retains in synchronism with the clock the data output from the first selector;

a multiplier which multiplies the coefficient data output from the first register and the data output from the second register to obtain product data;

a third register which retains in synchronism with the clock the product data output from the multiplier;

an adder which adds the product data output from the third register and current summed-up data together to obtain sum data;

a fourth register which retains in synchronism with the clock the sum data output from the adder; and a second selector which selects either one of data of a value "0" and the sum data output from the fourth register to feed back the selected data as the summed-up data to the adder.

6. An effect applying apparatus comprising:

a first memory which stores plural pieces of Finite Impulse Response (FIR) coefficient data used for implementing an FIR filter algorithm; and a processor which receives plural pieces of input data to be subjected to the FIR filter algorithm, the plural pieces of received input data being stored in a second memory, uses the plural pieces of FIR coefficient data stored in the first memory and the plural pieces of received input data stored in the second memory to multiply each piece of FIR coefficient data and each piece of input data together as many times as a number corresponding to a designated filter order, and sums up resultant products, wherein, when an acoustic effect is applied to an original tone by convoluting the original tone with impulse response data of an acoustic effect tone, the processor:

implements the FIR filter algorithm to convolute the original tone with first half data of the impulse response data in the time domain of a unit of a sampling period; and further implements a Fast Fourier Transform (FFT) algorithm on second half data of the impulse response data in the frequency domain of a unit of a block, thereby convoluting the original tone with the second half data.

7. The effect applying apparatus according to claim 6, wherein the first half data and the second half data of the impulse response data are set arbitrarily.

8. The effect applying apparatus according to claim 6, wherein the processor decides a block size of the block and sets a filter order of the FIR filter algorithm and an FFT point number of the FFT algorithm to twice as large as the block size.

9. The effect applying apparatus according to claim 8, wherein the processor decides the block size in accordance with a time length of the impulse response data.

10. The effect applying apparatus according to claim 8, wherein the processor decides the block size in accordance with a tone generation setting condition of the original tone.

11. The effect applying apparatus according to claim 8, wherein the processor:

stores coefficient data in the time domain of the impulse response data;

after deciding the block size, removes FIR coefficient data of a filter order equivalent to twice as large as the block size to be used for implementing the FIR filter algorithm from the coefficient data of the impulse response data to obtain remaining coefficient data; and implements the FFT algorithm on the remaining coefficient data to transform the same data to coefficient data for convolution in the frequency domain, expanding the same on a memory.

12. The effect applying apparatus according to claim 11, wherein the processor:

adds data indicating the decided block size to the coefficient data for convolution in the frequency domain and stores resultant data; and when the block size is decided again and only when the decided block size is different from the previously stored block size, implements the FFT algorithm on the coefficient data for convolution in the frequency domain, thereby renewing the same coefficient data.

13. A method for implementing a filter algorithm under control of a processor of a signal processing apparatus, the signal processing apparatus comprising a first memory which stores plural pieces of coefficient data to be used for implementing the filter algorithm and containing plural coefficient data sets as many as a number corresponding to a filter order of the filter algorithm for at least one sort of filter algorithm of a variable filter order, and a second memory which stores input data sets from a last sample to a sample before the (filter-order-1)-th sample for every filter algorithm as delay data sets, the method comprising:

receiving plural pieces of input data to be subjected to the filter algorithm;

designating a filter order of the filter algorithm;

implementing the filter algorithm using the plural pieces of coefficient data storing unit stored in the first memory and the plural pieces of received input data as many times as a number corresponding to the designated filter order, in which filter algorithm each piece of coefficient data and each piece of input data are multiplied together and resultant products are summed up, and outputting a result of implementing the filter algorithm, wherein the implementing the filter algorithm comprises successively receiving the coefficient data stored in the first memory and current input data stored in the second memory, repeatedly implementing a first-order filter algorithm by time division processing of a dividing time length corresponding to the filter order, and outputting output-data within each sampling period.

14. A method for implementing a Finite Impulse Response (FIR) filter algorithm under control of a processor of an effect applying apparatus, the effect applying apparatus comprising a first memory which stores plural pieces of Finite Impulse Response (FIR) coefficient data used for implementing the FIR filter algorithm, and a second memory, and the method comprising:

storing plural pieces of received input data to be subjected to the FIR filter algorithm in the second memory; and implementing the FIR filter algorithm using the plural pieces of FIR coefficient data stored in the first memory and the plural pieces of received input data stored in the second memory as many times as a number corresponding to a designated filter order, in which filter algorithm each piece of FIR coefficient data and each piece of input data are multiplied together and resultant products are summed up, wherein, when an acoustic effect is applied to an original tone by convoluting the original tone with impulse response data of an acoustic effect tone, the method further comprises:

implementing the FIR filter algorithm to convolute the original tone with first half data of the impulse response data in the time domain of a unit of a sampling period; and implementing a Fast Fourier Transform algorithm on second half data of the impulse response data in the frequency domain of a unit of a block, thereby convoluting the original tone with the second half data.

15. The method according to claim 14, wherein the first half data and the second half data of the impulse response data are set arbitrarily.

* * * * *

UNITED STATES PATENT AND TRADEMARK OFFICE
CERTIFICATE OF CORRECTION

PATENT NO.        : 10,339,907 B2
APPLICATION NO.   : 15/876406
DATED             : July 2, 2019
INVENTOR(S)       : Masuo Yokota Page 1 of 1

It is certified that error appears in the above-identified patent and that said Letters Patent is hereby corrected as shown below:

In the Claims

Column 27, Line 37, Claim 13, after "data" delete "storing unit".

Signed and Sealed this
First Day of October, 2019

Andrei Iancu
*Director of the United States Patent and Trademark Office*